(12) United States Patent
Ko et al.

(10) Patent No.: US 10,586,709 B2
(45) Date of Patent: Mar. 10, 2020

(54) METHODS OF FABRICATING SEMICONDUCTOR DEVICES

(71) Applicant: Samsung Electronics Co., Ltd., Suwon-si, Gyeonggi-do (KR)

(72) Inventors: Young-Min Ko, Hwaseong-si (KR); Hyuk Woo Kwon, Seoul (KR); Jun-Won Lee, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/030,212

(22) Filed: Jul. 9, 2018

(65) Prior Publication Data

US 2019/0172717 A1 Jun. 6, 2019

(30) Foreign Application Priority Data

Dec. 5, 2017 (KR) .......................... 10-2017-0166064

(51) Int. Cl.
| | |
|---|---|
| *H01L 21/308* | (2006.01) |
| *G03F 7/20* | (2006.01) |
| *H01L 21/033* | (2006.01) |
| *H01L 21/02* | (2006.01) |
| *H01L 21/3213* | (2006.01) |
| *H01L 21/311* | (2006.01) |

(52) U.S. Cl.
CPC ...... *H01L 21/3081* (2013.01); *G03F 7/70033* (2013.01); *H01L 21/02115* (2013.01); *H01L 21/033* (2013.01); *H01L 21/31144* (2013.01); *H01L 21/32135* (2013.01); *H01L 21/32139* (2013.01)

(58) Field of Classification Search
CPC .......... H01L 21/3081; H01L 21/02115; H01L 21/033; G03F 7/70033
See application file for complete search history.

(56) References Cited

U.S. PATENT DOCUMENTS

| | | | |
|---|---|---|---|
| 6,156,658 A | 12/2000 | Wang et al. | |
| 7,718,081 B2 | 5/2010 | Liu et al. | |
| 8,846,540 B2* | 9/2014 | Lee ..................... | H01L 21/3081 |
| | | | 257/E21.197 |
| 9,520,295 B2 | 12/2016 | Shaikh et al. | |
| 2009/0111281 A1* | 4/2009 | Bencher .............. | H01L 21/0337 |
| | | | 438/763 |

(Continued)

FOREIGN PATENT DOCUMENTS

| | | |
|---|---|---|
| KR | 2009-0045754 A | 5/2009 |
| KR | 2010-0053911 A | 5/2010 |

*Primary Examiner* — Karen Kusumakar
(74) *Attorney, Agent, or Firm* — Muir Patent Law, PLLC

(57) ABSTRACT

Methods for fabricating a semiconductor device are provided including sequentially forming a first hard mask layer, a second hard mask layer and a photoresist layer on a target layer, patterning the photoresist layer to form a photoresist pattern, sequentially patterning the second hard mask layer and the first hard mask layer using the photoresist pattern as an etching mask to form a first hard mask pattern and a second hard mask pattern on the first hard mask pattern, and etching the target layer using the first hard mask pattern and the second hard mask pattern as an etching mask, wherein the second hard mask layer includes impurity-doped amorphous silicon.

20 Claims, 28 Drawing Sheets

(56) References Cited

U.S. PATENT DOCUMENTS

| | | |
|---|---|---|
| 2009/0325081 A1 | 12/2009 | Ma et al. |
| 2010/0033702 A1 | 2/2010 | Rigato |
| 2010/0035431 A1 | 2/2010 | Wurm et al. |
| 2010/0055584 A1 | 3/2010 | Sato et al. |
| 2010/0091941 A1 | 4/2010 | Zocchi et al. |
| 2010/0112342 A1 | 5/2010 | Cho |
| 2010/0165310 A1 | 7/2010 | Sewell et al. |
| 2010/0196828 A1 | 8/2010 | Kawamura |
| 2010/0233598 A1 | 9/2010 | Matsunawa et al. |
| 2011/0032501 A1 | 2/2011 | Fukuhara et al. |
| 2011/0117479 A1 | 5/2011 | Suga et al. |
| 2011/0151357 A1 | 6/2011 | Nakajima et al. |
| 2011/0170083 A1 | 7/2011 | Scaccabarozzi et al. |
| 2011/0199599 A1 | 8/2011 | Mann |
| 2011/0240863 A1 | 10/2011 | Lee et al. |
| 2011/0244689 A1 | 10/2011 | Han et al. |
| 2011/0266140 A1 | 11/2011 | Kinoshita et al. |
| 2011/0285975 A1 | 11/2011 | Tawarayama |
| 2011/0286002 A1 | 11/2011 | Takai |
| 2011/0310460 A1 | 12/2011 | Lee et al. |
| 2012/0039522 A1 | 2/2012 | Dirksen et al. |
| 2012/0040291 A1 | 2/2012 | Sakamoto et al. |
| 2012/0040293 A1 | 2/2012 | Inanami et al. |
| 2012/0086925 A1 | 4/2012 | Kraus et al. |
| 2012/0127444 A1 | 5/2012 | Huh et al. |
| 2012/0128228 A1 | 5/2012 | Fujimura et al. |
| 2012/0156623 A1 | 6/2012 | Shirai |
| 2012/0183757 A1 | 7/2012 | Akiyama et al. |
| 2012/0288796 A1 | 11/2012 | Katayama et al. |
| 2012/0311511 A1 | 12/2012 | Taguchi et al. |
| 2012/0315581 A1 | 12/2012 | Hatakeyama et al. |
| 2013/0003036 A1 | 1/2013 | Akiyama et al. |
| 2013/0038716 A1 | 2/2013 | Cho et al. |
| 2013/0038850 A1 | 2/2013 | Feldmann et al. |
| 2013/0056642 A1 | 3/2013 | Lee et al. |
| 2013/0092655 A1 | 4/2013 | Yu et al. |
| 2013/0128248 A1 | 5/2013 | Komatsuda et al. |
| 2013/0135740 A1 | 5/2013 | Ko |
| 2013/0161543 A1 | 6/2013 | Park et al. |
| 2013/0189844 A1 | 7/2013 | Chen |
| 2013/0200498 A1 | 8/2013 | Mangan |
| 2013/0224659 A1 | 8/2013 | Ohashi et al. |
| 2013/0255717 A1 | 10/2013 | Rose et al. |
| 2013/0280893 A1 | 10/2013 | Lee et al. |
| 2013/0288482 A1 | 10/2013 | Nam et al. |
| 2014/0151327 A1 | 6/2014 | Une et al. |
| 2014/0158914 A1 | 6/2014 | Klebanoff et al. |
| 2014/0165236 A1 | 6/2014 | Budach et al. |
| 2014/0193975 A1 | 7/2014 | Ogihara et al. |
| 2014/0205951 A1 | 7/2014 | Ogihara et al. |
| 2014/0211178 A1 | 7/2014 | Ehm et al. |
| 2014/0213054 A1 | 7/2014 | Kim |
| 2014/0220489 A1 | 8/2014 | Kozuma et al. |
| 2014/0272684 A1 | 8/2014 | Hofmann et al. |
| 2014/0253892 A1 | 9/2014 | Yu et al. |
| 2014/0268074 A1 | 9/2014 | Chien et al. |
| 2014/0353526 A1 | 12/2014 | Fujimura |
| 2015/0042972 A1 | 2/2015 | Wise et al. |
| 2015/0058815 A1 | 2/2015 | Liu et al. |
| 2015/0062549 A1 | 3/2015 | Patra et al. |
| 2015/0062596 A1 | 3/2015 | Kwan et al. |
| 2015/0070681 A1 | 3/2015 | Uno et al. |
| 2015/0085272 A1 | 3/2015 | Saenger et al. |
| 2015/0131069 A1 | 5/2015 | Ota |
| 2015/0168845 A1 | 6/2015 | Lu et al. |
| 2015/0187602 A1 | 7/2015 | Kim et al. |
| 2015/0192459 A1 | 7/2015 | Kvamme |
| 2015/0192854 A1 | 7/2015 | Klipp et al. |
| 2015/0198754 A1 | 7/2015 | Ko |
| 2015/0204729 A1 | 7/2015 | Kusunose et al. |
| 2015/0221519 A1 | 8/2015 | Marks et al. |
| 2015/0226539 A1 | 8/2015 | Roeth et al. |
| 2015/0241779 A1 | 8/2015 | Enomoto |
| 2015/0241781 A1 | 8/2015 | Carcasi et al. |
| 2015/0241782 A1 | 8/2015 | Scheer et al. |
| 2015/0253675 A1 | 9/2015 | Chilese et al. |
| 2015/0253677 A1 | 9/2015 | Maul |
| 2015/0253679 A1 | 9/2015 | Loopstra et al. |
| 2015/0261081 A1 | 9/2015 | Takai |
| 2015/0262791 A1 | 9/2015 | Yagawa |
| 2015/0303055 A1 | 10/2015 | Xu et al. |
| 2015/0323387 A1 | 11/2015 | Saenger |
| 2015/0325402 A1 | 11/2015 | Weng et al. |
| 2015/0331324 A1 | 11/2015 | Chang et al. |
| 2015/0346598 A1 | 12/2015 | Degünther et al. |
| 2015/0362438 A1 | 12/2015 | Mann |
| 2015/0371855 A1 | 12/2015 | Yang et al. |
| 2016/0004153 A1 | 1/2016 | Shoki et al. |
| 2016/0013058 A1 | 1/2016 | Tu et al. |
| 2016/0033863 A1 | 2/2016 | Chen et al. |
| 2016/0033866 A1 | 2/2016 | Lu et al. |
| 2016/0042111 A1 | 2/2016 | Chang |
| 2016/0048071 A1 | 2/2016 | Lu et al. |
| 2016/0062250 A1 | 3/2016 | Hung et al. |
| 2016/0070971 A1 | 3/2016 | Nakashima |
| 2016/0077426 A1 | 3/2016 | Jang et al. |
| 2016/0077436 A1 | 3/2016 | Sakurai et al. |
| 2016/0077441 A1 | 3/2016 | Kugler et al. |
| 2016/0085003 A1 | 3/2016 | Jaiswal |
| 2016/0085144 A1 | 3/2016 | Chen et al. |
| 2016/0085906 A1 | 3/2016 | Huang et al. |
| 2016/0096977 A1 | 4/2016 | Tachibana et al. |
| 2016/0096978 A1 | 4/2016 | Tachibana et al. |
| 2016/0109384 A1 | 4/2016 | Nakanishi et al. |
| 2016/0109792 A1 | 4/2016 | Mikami |
| 2016/0139501 A1 | 5/2016 | Kim et al. |
| 2016/0147137 A1 | 5/2016 | Shih et al. |
| 2016/0147138 A1 | 5/2016 | Shih et al. |
| 2016/0147139 A1 | 5/2016 | Onoue et al. |
| 2016/0154301 A1 | 6/2016 | Ekinci |
| 2016/0155631 A1 | 6/2016 | Tanaka |
| 2016/0161838 A1 | 6/2016 | Yu et al. |
| 2016/0161846 A1 | 6/2016 | Klipp et al. |
| 2016/0169816 A1 | 6/2016 | Peters et al. |
| 2016/0170309 A1 | 6/2016 | Oizumi |
| 2016/0178996 A1 | 6/2016 | Shih et al. |
| 2016/0179013 A1 | 6/2016 | Kugler et al. |
| 2016/0181134 A1 | 6/2016 | Budiarto et al. |
| 2016/0195816 A1 | 7/2016 | Endres |
| 2016/0202601 A1 | 7/2016 | Onoue |
| 2016/0202605 A1 | 7/2016 | Huang et al. |
| 2016/0209747 A1 | 7/2016 | Yamaguchi |
| 2016/0223898 A1 | 8/2016 | Nakanishi |
| 2016/0223899 A1 | 8/2016 | Shih et al. |
| 2016/0223900 A1 | 8/2016 | Huang et al. |
| 2016/0225477 A1 | 8/2016 | Banine et al. |
| 2016/0231647 A1 | 8/2016 | Hsu et al. |
| 2016/0238755 A1 | 8/2016 | Jaiswal |
| 2016/0252823 A1 | 9/2016 | Patra et al. |
| 2016/0266483 A1 | 9/2016 | Van Setten et al. |
| 2016/0268176 A1 | 9/2016 | Heo et al. |
| 2016/0274029 A1 | 9/2016 | Bol et al. |
| 2016/0274452 A1 | 9/2016 | Kamo |
| 2016/0274454 A1 | 9/2016 | Beasley et al. |
| 2016/0280621 A1 | 9/2016 | Yokokawa et al. |
| 2016/0280675 A1 | 9/2016 | Yamaguchi et al. |
| 2016/0282280 A1 | 9/2016 | Foad et al. |
| 2016/0282713 A1 | 9/2016 | Huang et al. |
| 2016/0282720 A1 | 9/2016 | Takahashi et al. |
| 2016/0299443 A1 | 10/2016 | Anderl et al. |
| 2016/0306272 A1 | 10/2016 | Lu et al. |
| 2016/0306282 A1 | 10/2016 | Huang et al. |
| 2016/0314991 A1 | 10/2016 | Ogihara et al. |
| 2016/0320700 A1 | 11/2016 | Yokokawa et al. |
| 2016/0327854 A1 | 11/2016 | Chang et al. |
| 2016/0329210 A1 | 11/2016 | Mao et al. |
| 2016/0329239 A1 | 11/2016 | HuangFu |
| 2016/0334709 A1 | 11/2016 | Huli et al. |
| 2016/0334719 A1 | 11/2016 | Schwertner et al. |
| 2016/0342096 A1 | 11/2016 | Foad |
| 2016/0343578 A1 | 11/2016 | Bencher |
| 2016/0347965 A1 | 12/2016 | Umezaki et al. |
| 2016/0349610 A1 | 12/2016 | Hsu et al. |
| 2016/0357099 A1 | 12/2016 | Kim et al. |

(56) References Cited

U.S. PATENT DOCUMENTS

| | | |
|---|---|---|
| 2016/0357100 A1 | 12/2016 | Ikuta |
| 2016/0377983 A1 | 12/2016 | Yu et al. |
| 2016/0377988 A1 | 12/2016 | Paul et al. |
| 2017/0003591 A1 | 1/2017 | Mochizuki et al. |
| 2017/0010525 A1 | 1/2017 | Shoki et al. |
| 2017/0011929 A1 | 1/2017 | Jun et al. |
| 2017/0015779 A1 | 1/2017 | Jung et al. |
| 2017/0015785 A1 | 1/2017 | Jung et al. |
| 2017/0017147 A1 | 1/2017 | Shih et al. |
| 2017/0025274 A1 | 1/2017 | Engelmann et al. |
| 2017/0031241 A1 | 2/2017 | Shen et al. |
| 2017/0038671 A1 | 2/2017 | Takai |
| 2017/0038673 A1 | 2/2017 | Ikebe et al. |
| 2017/0040221 A1 | 2/2017 | Kim et al. |
| 2017/0052129 A1 | 2/2017 | Weng et al. |
| 2017/0052443 A1 | 2/2017 | Lin et al. |
| 2017/0052456 A1 | 2/2017 | Van Schoot et al. |
| 2017/0053774 A1 | 2/2017 | Wang et al. |
| 2017/0060005 A1 | 3/2017 | Chang et al. |
| 2017/0068174 A1 | 3/2017 | Michaelson et al. |
| 2017/0074802 A1 | 3/2017 | Takai |
| 2017/0075231 A1 | 3/2017 | Ekinci et al. |
| 2017/0087585 A1 | 3/2017 | Dattilo et al. |
| 2017/0090172 A1 | 3/2017 | Johnson |
| 2017/0090278 A1 | 3/2017 | Chiu et al. |
| 2017/0092474 A1 | 3/2017 | Maas et al. |
| 2017/0108767 A1 | 4/2017 | Kim et al. |
| 2017/0115555 A1 | 4/2017 | Hofmann et al. |
| 2017/0115557 A1 | 4/2017 | Peters et al. |
| 2017/0115578 A1 | 4/2017 | Berendsen et al. |
| 2017/0123118 A1 | 5/2017 | Bittner et al. |
| 2017/0123304 A1 | 5/2017 | Ryu |
| 2017/0123327 A1 | 5/2017 | Jang et al. |
| 2017/0131627 A1 | 5/2017 | Hassan et al. |
| 2017/0131629 A1 | 5/2017 | Hamamoto et al. |
| 2017/0131637 A1 | 5/2017 | Hofmann et al. |
| 2017/0140927 A1 | 5/2017 | Shih et al. |
| 2017/0146902 A1 | 5/2017 | Lairson et al. |
| 2017/0146911 A1 | 5/2017 | Komatsuda |
| 2017/0153555 A1 | 6/2017 | Hof |
| 2017/0160632 A1 | 6/2017 | Hassan et al. |
| 2017/0168399 A1 | 6/2017 | Andre et al. |
| 2017/0176850 A1 | 6/2017 | Chen et al. |
| 2017/0176868 A1 | 6/2017 | Van Schoot et al. |
| 2017/0178896 A1 | 6/2017 | Matsuki et al. |

* cited by examiner

METHODS OF FABRICATING SEMICONDUCTOR DEVICES

CLAIM OF PRIORITY

This application claims priority to Korean Patent Application No. 10-2017-0166064 filed on Dec. 5, 2017 in the Korean Intellectual Property Office, and all the benefits accruing therefrom under 35 U.S.C. 119, the contents of which are hereby incorporated herein by reference as if set forth in its entirety.

FIELD

The present inventive concept related generally to semiconductor devices and, more particularly, to methods of fabricating semiconductor devices.

BACKGROUND

Recently, semiconductor devices are being developed to perform at high-speeds at a low voltage and semiconductors are being fabricated to increase the degree of integration thereof. Thus, the highly scaled patterns of highly integrated semiconductor devices have fine widths and may be spaced apart at small pitches.

Extreme ultraviolet (EUV) lithography technology has been introduced to form semiconductor devices having fine widths. The thickness of a photoresist in the etching of semiconductor devices using EUV lithography is one of important factors for improving productivity. Various techniques have been proposed to reduce the thickness of the photoresist required for pattern formation.

SUMMARY

Some embodiments of the present inventive concept provide methods of fabricating a semiconductor device including sequentially forming a first hard mask layer, a second hard mask layer and a photoresist layer on a target layer, patterning the photoresist layer to form a photoresist pattern, sequentially patterning the second hard mask layer and the first hard mask layer using the photoresist pattern as an etching mask to form a first hard mask pattern and a second hard mask pattern on the first hard mask pattern, and etching the target layer using the first hard mask pattern and the second hard mask pattern as an etching mask, wherein the second hard mask layer includes impurity-doped amorphous silicon.

Further embodiments of the present inventive concept provide methods of fabricating a semiconductor device including forming, on a substrate, a device isolation layer defining an active region, forming a buried gate in the active region, forming, on the substrate, a metal layer in contact with the active region, forming a first hard mask layer on the metal layer, a second hard mask layer on the first hard mask layer, and a photoresist layer on the second hard mask layer, patterning the photoresist layer to form a photoresist pattern, patterning the second hard mask layer using the photoresist pattern as an etching mask to form a second hard mask pattern, patterning the first hard mask layer using the second hard mask pattern as an etching mask to form a first hard mask pattern, etching the metal layer using the first hard mask pattern and the second hard mask pattern as an etching mask to form a metal layer pattern, wherein the first hard mask layer includes impurity-doped amorphous silicon.

Still further embodiments of the present inventive concept provide methods of fabricating a semiconductor device including sequentially forming a first hard mask layer, a second hard mask layer and a photoresist layer on a target layer, the first hard mask layer including an amorphous carbon layer and the second hard mask layer including impurity-doped amorphous silicon, patterning the photoresist layer to form a photoresist pattern, etching the second hard mask layer using the photoresist pattern as an etching mask to form a second hard mask pattern, and etching the first hard mask layer using the second hard mask pattern as an etching mask to form a first hard mask pattern.

Some embodiments of the present inventive concept provide methods of fabricating a semiconductor device including forming, on a substrate, a device isolation layer defining an active region, forming a buried gate in the active region, forming an interlayer insulating layer on the substrate, and a bit line structure and a landing pad in the interlayer insulating layer, the landing pad being electrically connected to the active region, forming an insulating layer on the interlayer insulating layer, forming a first hard mask layer on the insulating layer, a second hard mask layer on the first hard mask layer, and a photoresist layer on the second hard mask layer, patterning the photoresist layer to form a photoresist pattern, patterning the second hard mask layer using the photoresist pattern as an etching mask to form a second hard mask pattern, patterning the first hard mask layer using the second hard mask pattern as an etching mask to form a first hard mask pattern, etching the insulating layer using the first hard mask pattern and the second hard mask pattern as an etching mask to form a trench, and forming a capacitor electrically connected to the landing pad through the trench, wherein the first hard mask layer includes impurity-doped amorphous silicon.

Further embodiments of the present inventive concept provide methods of fabricating a semiconductor device including of fabricating a semiconductor device includes sequentially forming a first hard mask layer, a second hard mask layer and a photoresist layer on a substrate, patterning the photoresist layer to form a photoresist pattern, sequentially patterning the second hard mask layer and the first hard mask layer using the photoresist pattern as an etching mask to form a first hard mask pattern and a second hard mask pattern on the first hard mask pattern, etching the substrate using the first hard mask pattern and the second hard mask pattern as an etching mask to form a fin pattern extending in one direction, wherein the second hard mask layer includes impurity-doped amorphous silicon.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF EMBODIMENTS

Figure 1:
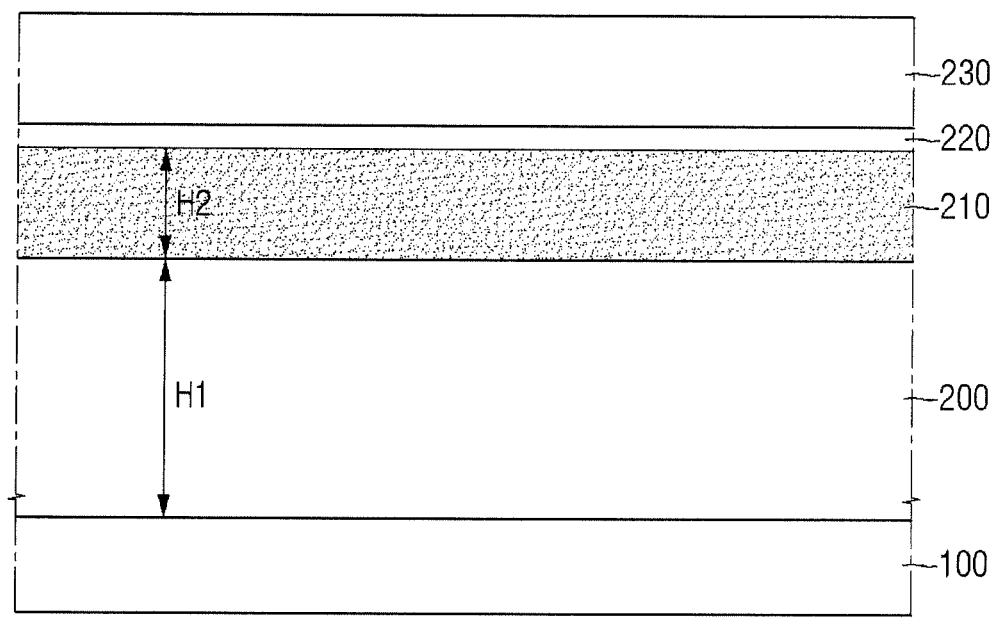
FIGS. 1 to 5 are diagrams illustrating processing steps in the fabrication of semiconductor devices in accordance with some embodiments of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation Furthermore to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, For example, of manufacturing techniques and/or tolerances, are to be expected. Thus, example embodiments should not be construed as limited to the particular shapes of regions illustrated herein but are to include deviations in shapes that result, For example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 5 are cross sections illustrating processing steps in the fabrication of a semiconductor device in accordance with some embodiments of the present inventive concept. Referring first to FIG. 1, a first hard mask layer 200, a second hard mask layer 210, a lower layer 220 and a photoresist layer 230 are sequentially formed on a target layer 100.

The target layer 100 may include a target formed using the method discussed herein in accordance with some embodiments of the present inventive concept. In some embodiments, the target may include, but is not limited to, a metal layer, an oxide layer, a nitride layer and the like. Details of the target layer 100 will be discussed further below.

The first hard mask layer 200 may be formed on the target layer 100. The first hard mask layer 200 may be, for example, an amorphous carbon layer (ACL). However, the present inventive concept is not limited thereto. For example, the first hard mask layer 200 may be a silicon-containing material such as silicon oxide (SiOx), silicon oxynitride (SiON), silicon nitride (SiN$_y$), tetraethyl orthosilicate (TEOS) or polycrystalline silicon without departing from the scope of the present inventive concept. The first hard mask layer 200 may be patterned to function as an etching mask in a process of etching the target layer 100.

The first hard mask layer 200 on the target layer 100 may be formed using, for example, atomic layer deposition (ALD), chemical vapor deposition (CVD), or spin coating. In some embodiments, a bake process or a curing process may be added to the process.

In some embodiments of the present inventive concept, an etch stop layer may be interposed between the target layer 100 and the first hard mask layer 200, but the present inventive concept is not limited thereto.

The second hard mask layer 210 may be formed on the first hard mask layer 200. The material of the second hard mask layer 210 may be different from the material of the first hard mask layer 200. The second hard mask layer 210 may include a material having an etching selectivity with respect to the first hard mask layer 200. For example, the second hard mask layer 210 may include impurity-doped amorphous silicon.

The impurity may include, for example, a pentavalent element such as phosphorus (P), arsenic (As) and the like.

The formation of the second hard mask layer 210 may include forming an amorphous silicon layer on the first hard mask layer 200, doping impurities into the amorphous silicon layer through an ion implantation process and annealing the impurity-doped amorphous silicon layer.

The second hard mask layer 210 may function as an etching mask for forming the first hard mask layer 200.

In some embodiments of the present inventive concept, a thickness H1 of the first hard mask layer 200 may be greater than a thickness H2 of the second hard mask layer 210.

The lower layer 220 may be formed on the second hard mask layer 210. The lower layer 220 may be interposed between the second hard mask layer 210 and the photoresist layer 230 so that the photoresist layer 230 can be fixed on the second hard mask layer 210. The lower layer 220 includes, for example, a carbon-based material, but the present inventive concept is not limited thereto.

The photoresist layer 230 may be formed on the lower layer 220. The photoresist layer 230 may be formed through a film coating process such as a spin coating process, a dip coating process, a spray coating process or the like. In some embodiments of the present inventive concept, the photoresist layer 230 may be formed by baking or curing a preliminary photoresist film formed through the film coating process.

The photoresist layer 230 may function as an etching mask for etching the lower layer 220, the second hard mask layer 210 and the first hard mask layer 200.

The photoresist layer 230 may include a material different from the second hard mask layer 210. The photoresist layer 230 may include a material having an etching selectivity with respect to the second hard mask layer 210.

Figure 2:
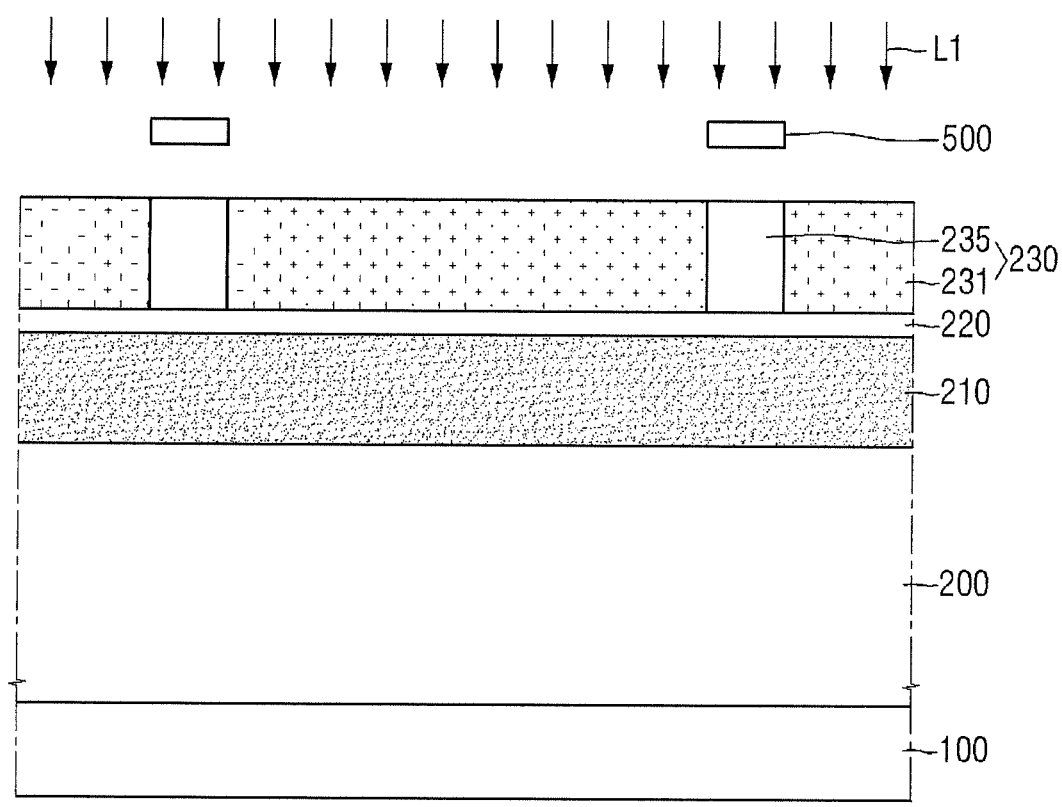

Referring to FIG. 2, an exposure process is performed by irradiating light L1 onto the photoresist layer 230. The exposure process may be performed by disposing an exposure mask 500 on the photoresist layer 230 and irradiating light through an opening included in the exposure mask 500. In some embodiments, the light L1 to be used in the exposure process may include extreme ultraviolet (EUV) light, but the present inventive concept is not limited thereto. For example, the light L1 may include light from a light source such as ArF, KrF and electron beam.

By performing the exposure process using the light L1, the photoresist layer 230 may be divided into an exposed portion 231 and an unexposed portion 235.

Figure 3:
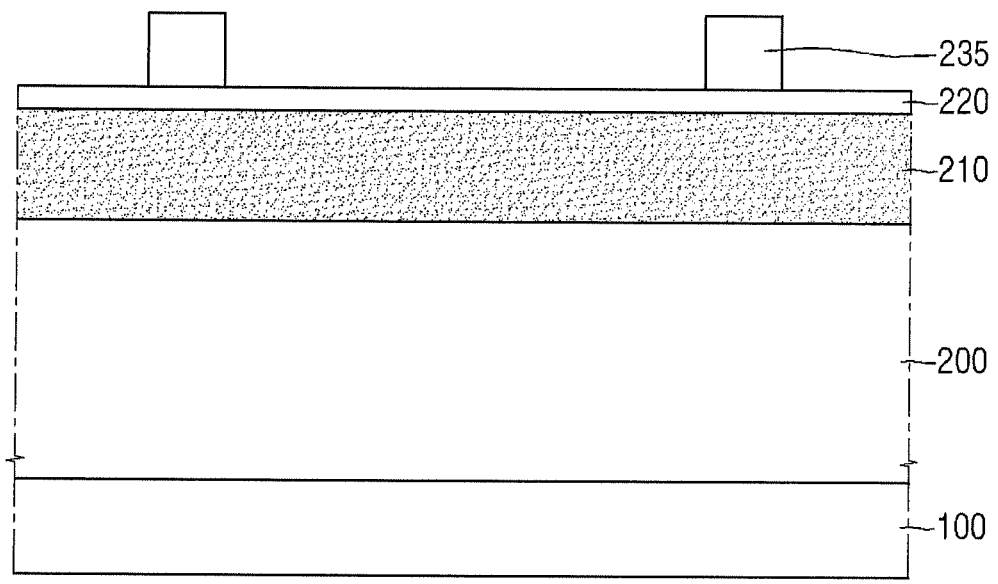

Then, referring to FIG. 3, the exposed portion 231 may be selectively removed from the photoresist layer 230 through a developing process. The remaining unexposed portion which is not removed after the developing process is performed may be defined as a photoresist pattern 235.

In some embodiments, the developing process may use an aqueous solution, tetramethyl-ammonium-hydroxide (TMAH) and alcohol, but the present inventive concept is not limited thereto.

Figure 4:
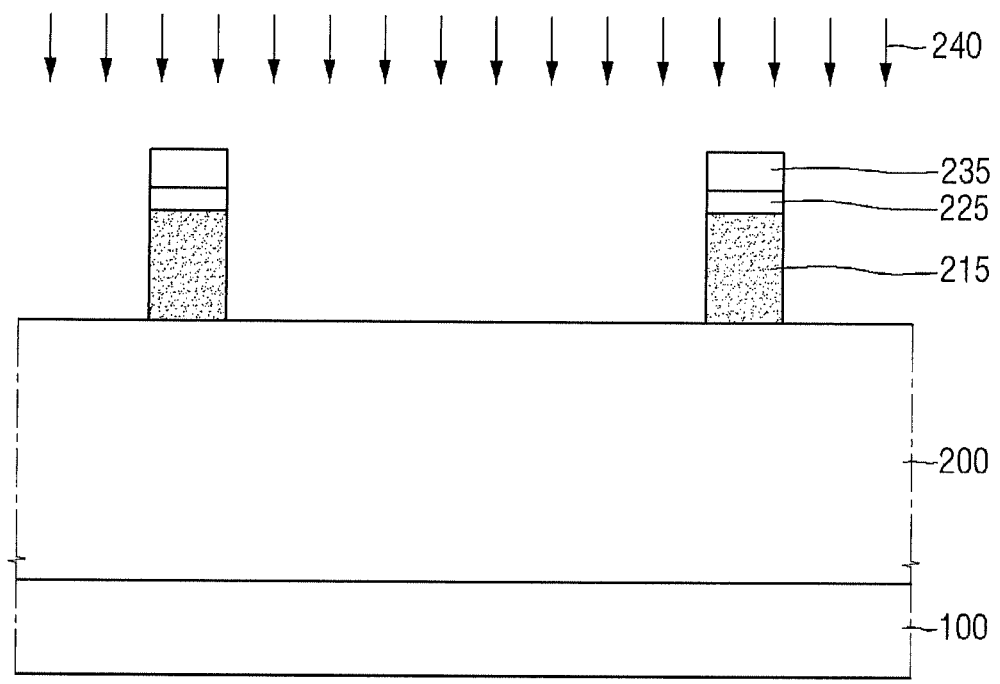

Referring to FIG. 4, the lower layer 220 and the second hard mask layer 210 are etched using the photoresist pattern 235 as an etching mask.

The lower layer 220 may be first etched using the photoresist pattern 235 as an etching mask, and then the second hard mask layer 210 may be etched sequentially. However, the present inventive concept is not limited thereto. The lower layer 220 and the second hard mask layer 210 may be etched in the same process.

The etching of the lower layer 220 and the second hard mask layer 210 may be a dry etching process using an etching gas 240 such as $CF_4$.

The photoresist pattern 235 may have an etching selectivity with respect to the second hard mask layer 210. As described above, the second hard mask layer 210 may be an impurity-doped amorphous silicon layer. When the general second hard mask layer 210 includes an impurity-doped amorphous silicon layer, the etching amount of the second hard mask layer 210 within the same time period may be increased as compared with a case where an undoped amorphous silicon layer is used. In other words, when the second hard mask layer 210 is doped with impurities, the etching selectivity of the photoresist pattern 235 may increase.

In particular, when the second hard mask layer 210 in an amorphous silicon state is doped with pentavalent elements such as phosphorus (P) and arsenic (As) as described above, the etching rate of the second hard mask layer 210 may be increased.

Figure 28:
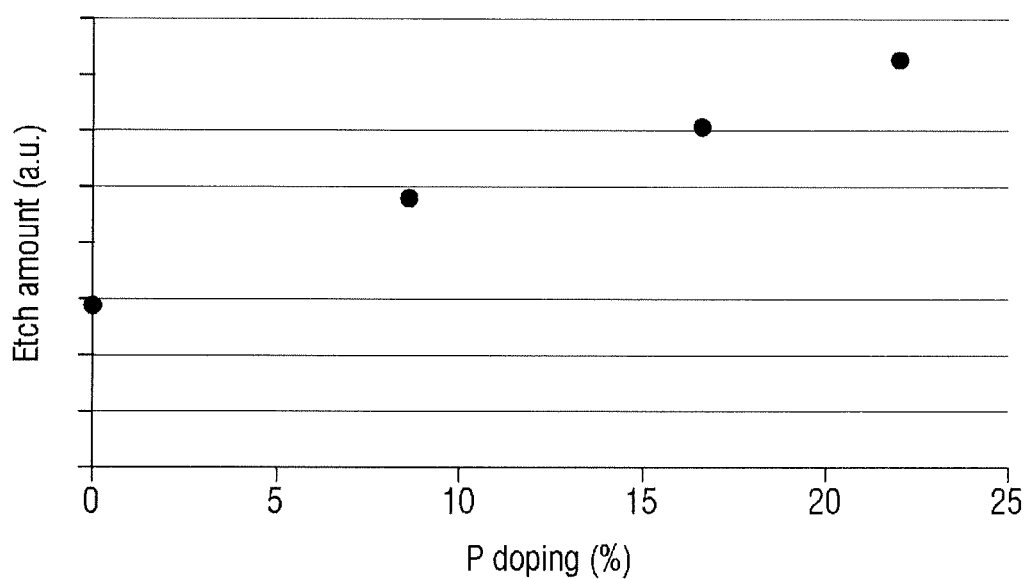
FIG. 28 is a graph showing a change in etching rate according to the concentration of phosphorus (P) doped in the hard mask layer in accordance with some embodiments of the present inventive concept.

As can be seen from FIG. 28, when the phosphorus (P) among the pentavalent elements is doped into the second hard mask layer 210, as the concentration of phosphorus (P) doped in the second hard mask layer 210 increases, the etching rate of the second hard mask layer 210 may increase.

The photoresist pattern 235 is used as an etching mask in the process of etching the lower layer 220, the second hard mask layer 210 and the first hard mask layer 200 below the photoresist pattern 235. The thickness of the photoresist pattern 235 is gradually reduced as it is damaged due to the etching. The initial photoresist layer 230 needs to be formed so as to have a sufficient thickness margin such that the photoresist pattern 235 remains until the first hard mask layer 200 is patterned.

However, an increase in the thickness of the photoresist layer 230 may increase the time required for the exposure process described with reference to FIG. 2. In other words, as the thickness of the photoresist layer 230 increases, the time required for the photoresist layer 230 to absorb sufficient light L1 until completion of the exposure may be increased. Such an increase in exposure time leads to an increase in unit per equipment hour (UPEH), which may reduce the production amount of semiconductor devices.

In the method of fabricating a semiconductor device according to some embodiments of the present inventive concept, the second hard mask layer 210 may include impurity-doped amorphous silicon. In this case, the etching selectivity of the photoresist pattern 235 is increased as compared to a case where the second hard mask layer 210 includes amorphous silicon undoped with impurities, and the thickness of the photoresist layer 230 required to complete the etching of the first hard mask layer 200 may also be reduced.

After the etching of the lower layer 220 and the second hard mask layer 210 is completed, a lower layer pattern 225 and a second hard mask pattern 215 may be formed. After the formation of the lower layer pattern 225 and the second hard mask pattern 215 is completed, the photoresist pattern 235 may remain without being completely etched.

Figure 5:
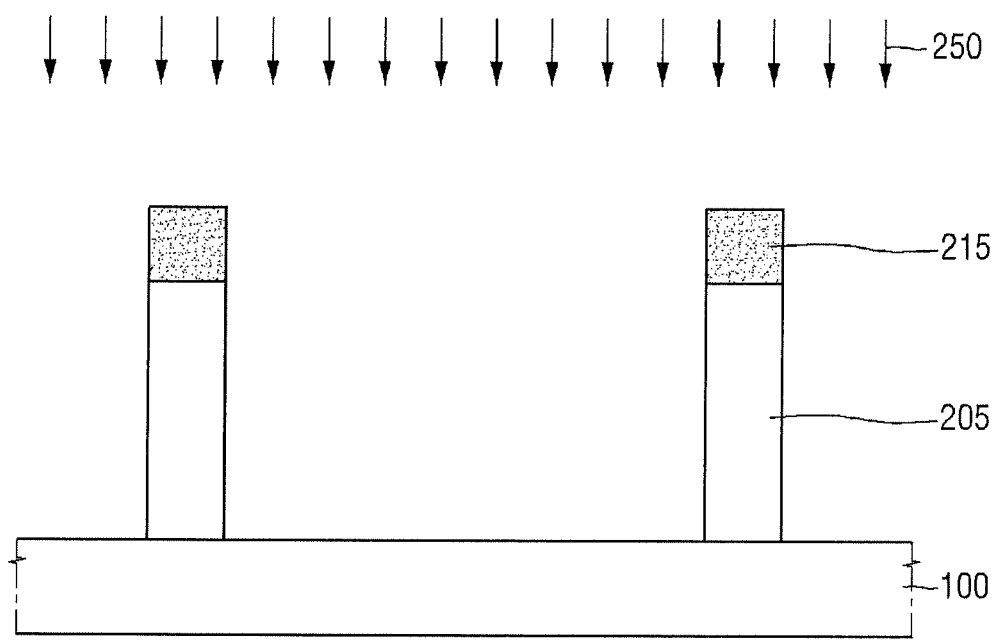

Subsequently, referring to FIG. 5, the first hard mask layer 200 is etched using the photoresist pattern 235, the lower layer pattern 225 and the second hard mask pattern 215 as an etching mask.

The etching of the first hard mask layer 200 may be performed by a dry etching process using an etching gas 250, such as, for example, oxygen ($O_2$) gas.

The first hard mask layer 200 may be etched to form a first hard mask pattern 205 on the target layer 100. When the formation of the first hard mask pattern 205 is completed, the photoresist pattern 235, the lower layer pattern 225 and the second hard mask pattern 215 may be completely removed on the first hard mask pattern 205, but the present inventive concept is not limited thereto. In some embodiments, the patterns may remain on the first hard mask pattern 205 without being completely removed. The first hard mask pattern 205 may function as an etching mask in a patterning process of the target layer 100 in a subsequent process.

FIGS. 6 to 12 are cross sections illustrating processing steps in the fabrication of semiconductor devices in accordance with some embodiments of the present inventive concept. In the following description, components having reference numerals similar to those of the components discussed above with respect to FIGS. 1 through 5 may represent similar components.

Figure 6:
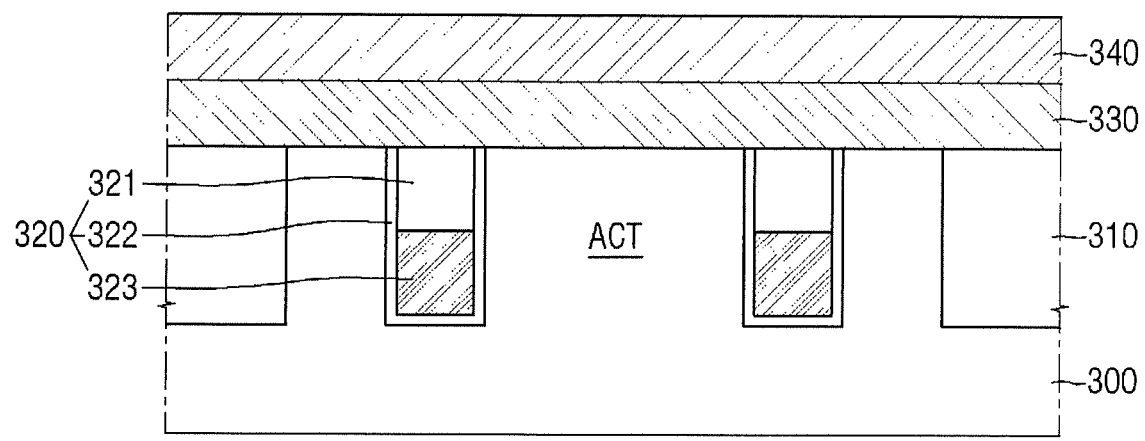
FIGS. 6 to 12 are diagrams processing steps in the fabrication of semiconductor devices in accordance with some embodiments of the present inventive concept.

Referring to FIG. 6, an etching target is provided in which a substrate 300, a buried gate 320, a bit line contact plug layer 330 and a bit line electrode layer 340 are formed. In particular, providing the etching target may include defining an active region ACT by forming a device isolation layer 310 on the substrate 300, forming the buried gate 320 in the active region ACT and forming the bit line contact plug layer 330 and the bit line electrode layer 340 on the device isolation layer 310 and the buried gate 320.

The substrate 300 may be, for example, a bulk silicon or silicon-on-insulator (SOI) substrate. In some embodiments, the substrate 300 may be a silicon substrate or it may include other materials, such as silicon germanium, indium antimonide, lead tellurium compound, indium arsenide, indium phosphide, gallium arsenide, or gallium antimonide. In further embodiments, the substrate 300 may have an epitaxial layer on a base substrate. Hereinafter, it is assumed that the substrate 300 is a silicon substrate.

The device isolation layer 310 may be formed in the substrate 300 to define the active region ACT. In other words, the lower surface of the device isolation layer 310 may be formed at a level lower than the upper surface of the substrate 300 to define the active region ACT. The device isolation layer 310 may include, for example, an oxide layer, an oxynitride layer, or a nitride layer.

The formation of the buried gate may include forming a trench in the active region ACT and forming a gate insulating layer 322, a gate electrode 323 and a gate capping pattern 321 in the trench.

The gate insulating layer 322 may include, for example, an oxide layer, but the present inventive concept is not limited thereto. For example, it may include a high dielectric constant dielectric layer such as hafnium oxide, hafnium silicon oxide, lanthanum oxide, lanthanum aluminum oxide and the like. The gate insulating layer 322 may be formed to surround the gate electrode 323 and the gate capping pattern 321.

The gate insulating layer 322 may be formed by etching a portion of the active region ACT to form a gate trench and performing a thermal oxidation process on the surface of the active region ACT exposed by the gate trench, or forming silicon oxide or metal oxide on the surface of the active region ACT through a CVD process.

The gate electrode 323 may include, for example, a conductive material. The conductive material may include, for example, doped polysilicon, titanium nitride (TiN), tantalum nitride (TaN), tungsten nitride (WN), titanium (Ti), tantalum (Ta) and tungsten (W), but the present inventive concept is not limited thereto.

The gate electrode 323 may be formed by forming a gate electrode layer on the gate insulating layer 322 in the gate trench by filling a conductive material through, for example, an ALD process or a sputtering process, planarizing the gate electrode layer to expose the upper surface of the active region ACT through a chemical mechanical polishing (CMP) process, and partially removing the gate electrode layer formed inside the gate trench through an etch back process.

The gate capping pattern 321 may include, for example, one of silicon oxide, silicon nitride and silicon oxynitride. The gate capping pattern 321 may fill the rest of the gate trench filled by the gate insulating layer 322 and the gate electrode 323.

The gate capping pattern 321 may be formed by forming a capping layer on the gate insulating layer 322 and the gate electrode 323 of the gate trench using, for example, silicon nitride or the like and planarizing the capping layer so as to expose the surface of the active region ACT.

The formation of the bit line contact plug layer 330 may include forming monocrystalline silicon, for example, using an epitaxial growth process from the active region ACT of the substrate 300. In some embodiments, the bit line contact plug layer 330 may be formed of a doped semiconductor material, conductive metal nitride, metal or a metal-semiconductor compound on the active region 20 through a sputtering process, a PVD process, or an ALD process.

The bit line electrode layer 340 may be formed to include a conductive material such as tungsten on the bit line contact plug layer 330, for example. In some embodiments, a barrier layer including, for example, titanium, titanium nitride, tantalum or tantalum nitride may be additionally formed between the bit line electrode layer 340 and the bit line contact plug layer 330.

Figure 7:
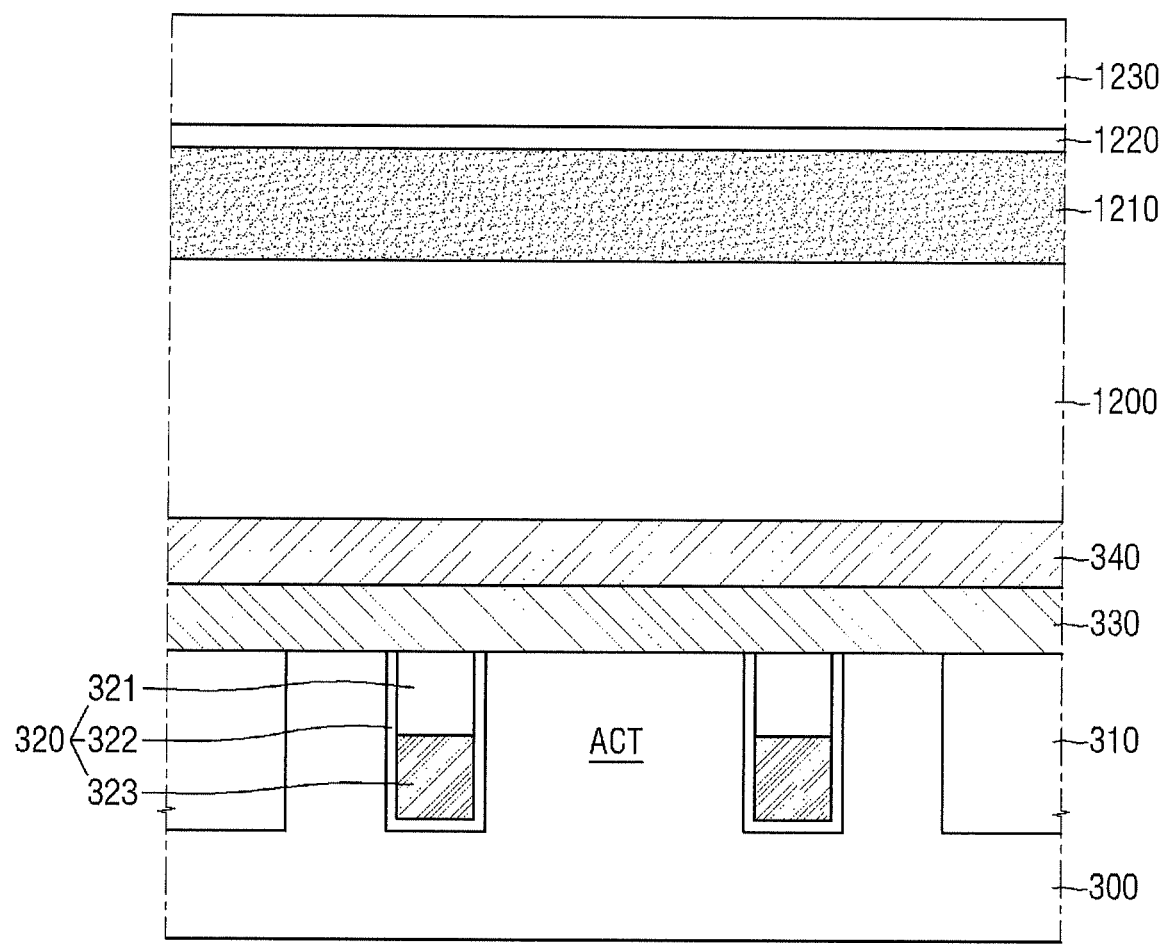

Referring to FIG. 7, a first hard mask layer 1200, a second hard mask layer 1210, a lower layer 1220 and a photoresist layer 1230 are sequentially formed on the bit line electrode layer 340.

The first hard mask layer 1200 may be formed on the bit line contact plug layer 330 by, for example, performing an ALD, CVD, spin coating or the like on an amorphous carbon layer ACL. In other words, the first hard mask layer 1200 may be formed to be similar to the first hard mask layer 200 described with reference to FIG. 1.

The second hard mask layer 1210 may be formed on the first hard mask layer 1200. The formation of the second hard mask layer 1210 may include forming an amorphous silicon layer on the first hard mask layer 1200, and forming a doped amorphous silicon layer by doping a pentavalent element such as phosphorus (P) and arsenic (As) as impurities, similarly to the second hard mask layer 210 described with reference to FIG. 1.

The lower layer 1220 and the photoresist layer 1230 may be formed on the second hard mask layer 1210. The lower layer 1220 and the photoresist layer 1230 may be formed by a process similar to that of the lower layer 220 and the photoresist layer 230 of FIG. 1, respectively.

Figure 8:
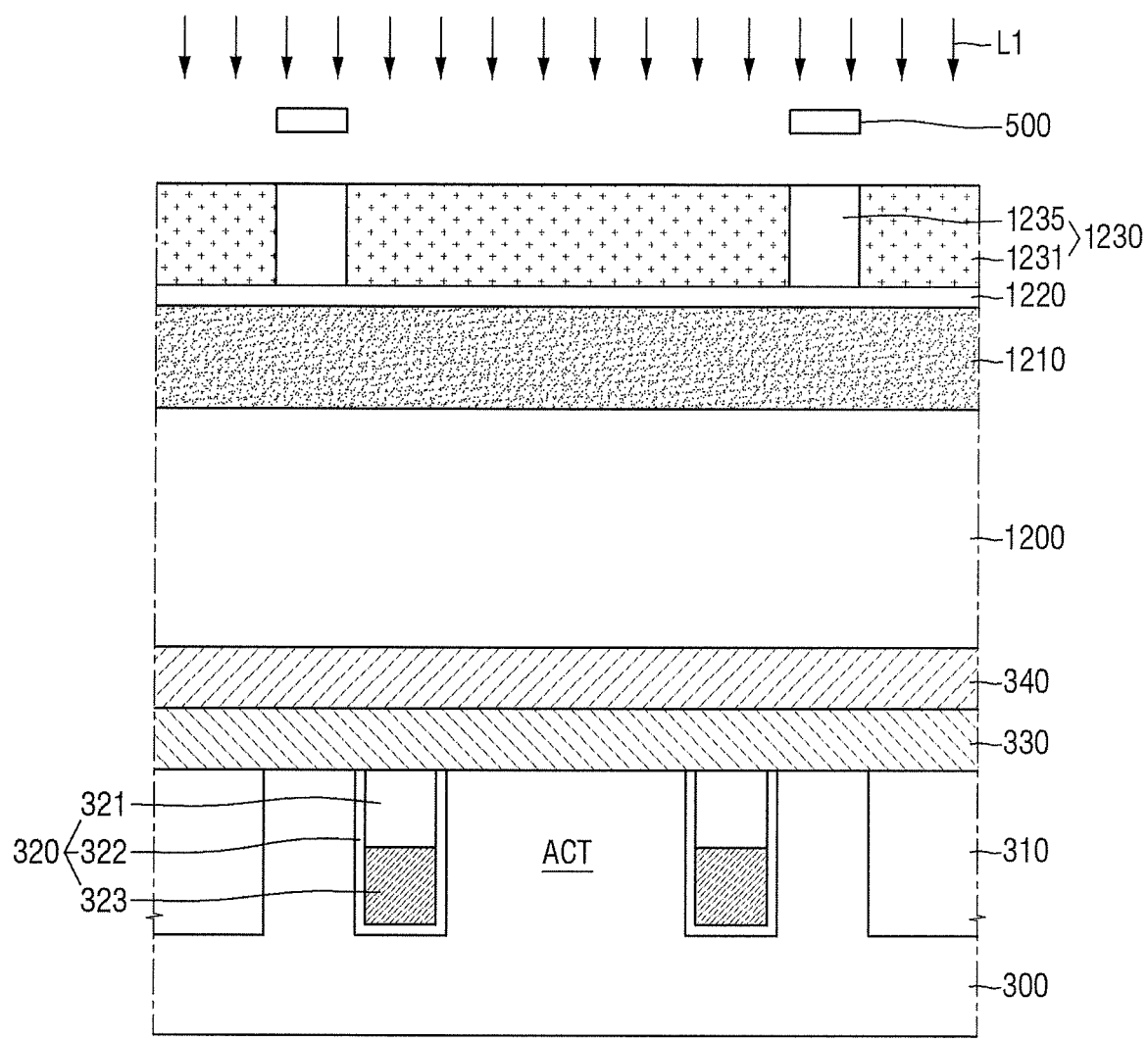

As illustrated in FIG. 8, an exposure process is performed by irradiating the photoresist layer 1230 with light L1. The exposure process may be performed by disposing an exposure mask 500 on the photoresist layer 1230 and irradiating light through an opening included in the exposure mask 500. As shown in FIG. 8, through the exposure process, the photoresist layer 1230 may be divided into an exposed portion 1231 exposed to the light L1 and an unexposed portion 1235.

Figure 9:
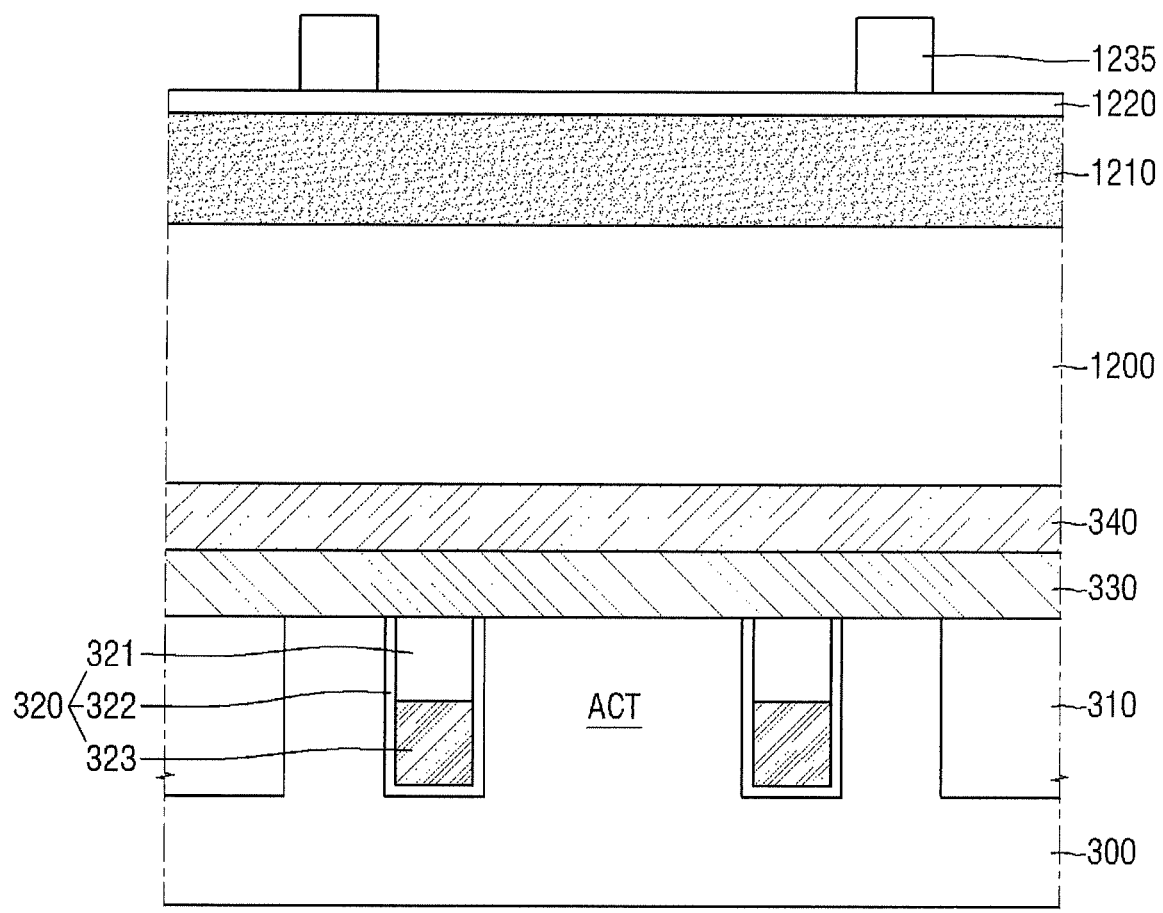

Referring now to FIG. 9, the exposed portion 1231 is selectively removed from the photoresist layer 1230 through a developing process. A portion of the photoresist layer 1230 which remains without being removed may be formed on the lower layer 1220 as a photoresist pattern 1235.

Figure 10:
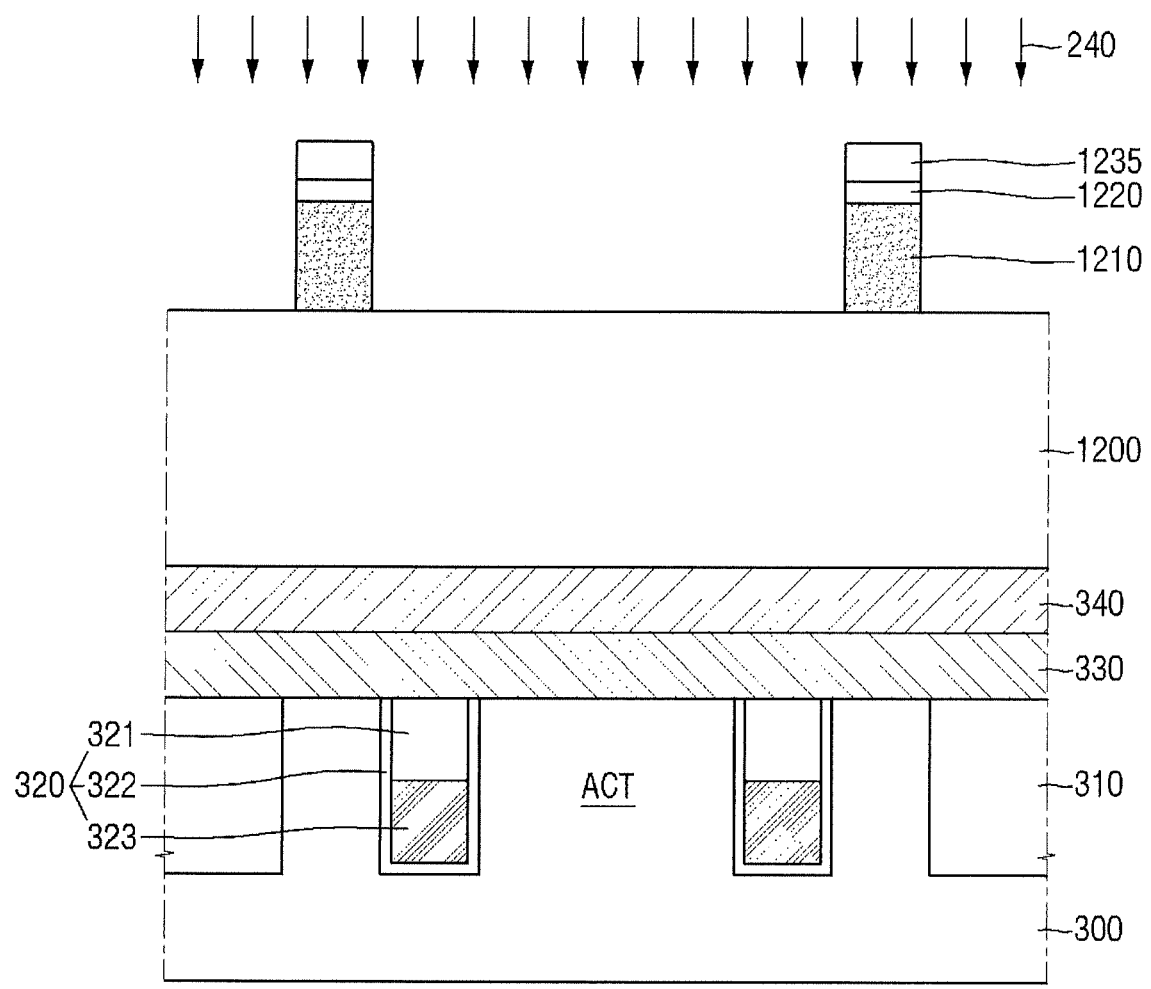

Referring to FIG. 10, the lower layer 1220 and the second hard mask layer 1210 are patterned using the photoresist pattern 1235 as an etching mask.

As discussed above, the photoresist pattern 1235 may have an etching selectivity with respect to the second hard mask layer 1210. Furthermore, as the second hard mask layer 1210 includes an impurity-doped amorphous silicon layer, the etching selectivity of the photoresist pattern 1235 may be increased as compared with a case where the second hard mask layer 1210 is an undoped amorphous silicon layer. Therefore, the thickness of the photoresist pattern 1235 required for etching the second hard mask layer 1210 having the same thickness may be reduced, and the time required for the semiconductor device fabricating method may be reduced.

When the etching of the lower layer 1220 and the second hard mask layer 1210 is completed, a lower layer pattern 1225 and a second hard mask pattern 1215 may be formed. Even after the formation of the lower layer pattern 1225 and the second hard mask pattern 1215 is completed, the photoresist pattern 1235 may remain without being completely etched.

Figure 11:
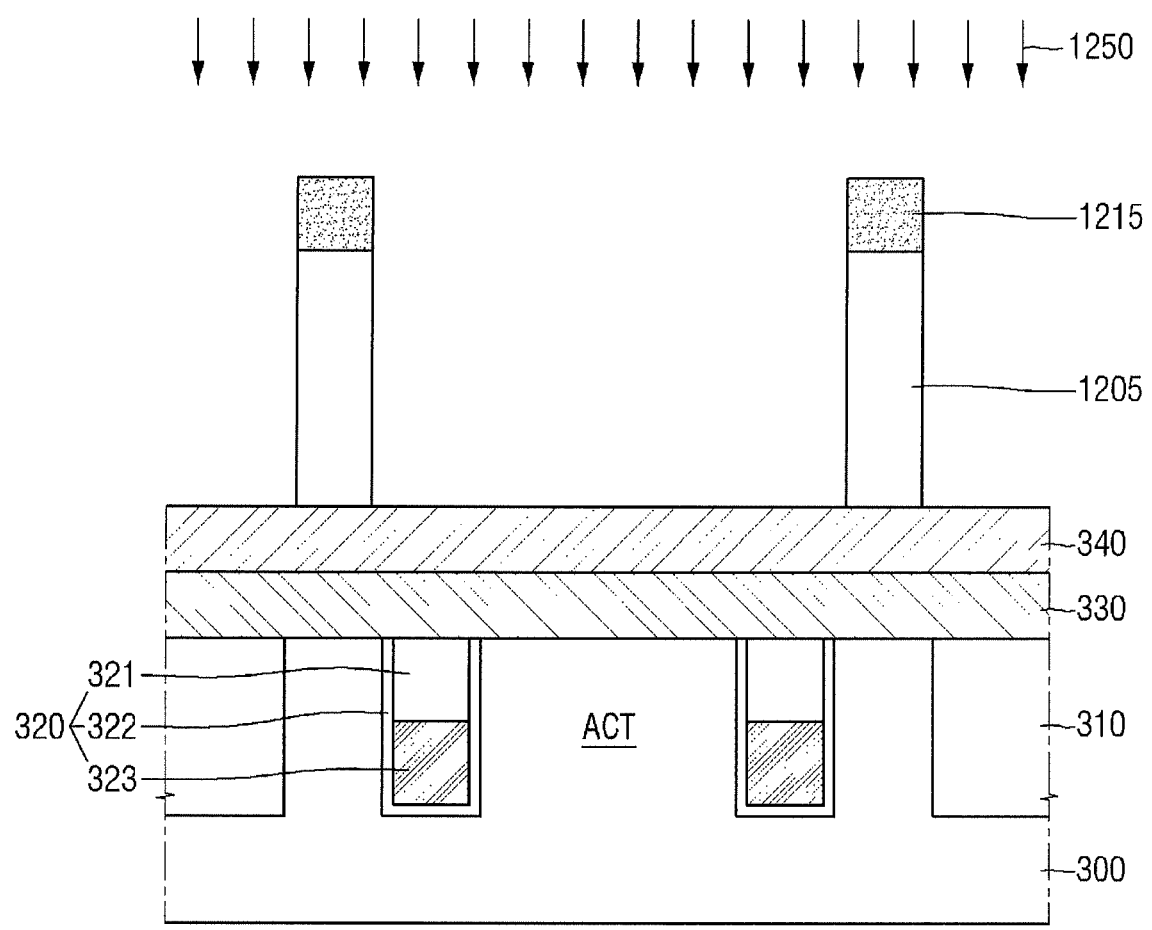

Referring to FIG. 11, the first hard mask layer 1200 is patterned using the photoresist pattern 1235, the lower layer pattern 1225 and the second hard mask pattern 1215 as an etching mask. As a result of patterning, the first hard mask layer 1200 is etched to form a first hard mask pattern 1205 on the bit line electrode layer 340.

Although it is illustrated in FIG. 11 that the second hard mask pattern 1215 remains on the first hard mask pattern 1205, the present inventive concept is not limited thereto. In some embodiments, on the first hard mask pattern 1205, the second hard mask pattern 1215 may be completely removed.

Figure 12:
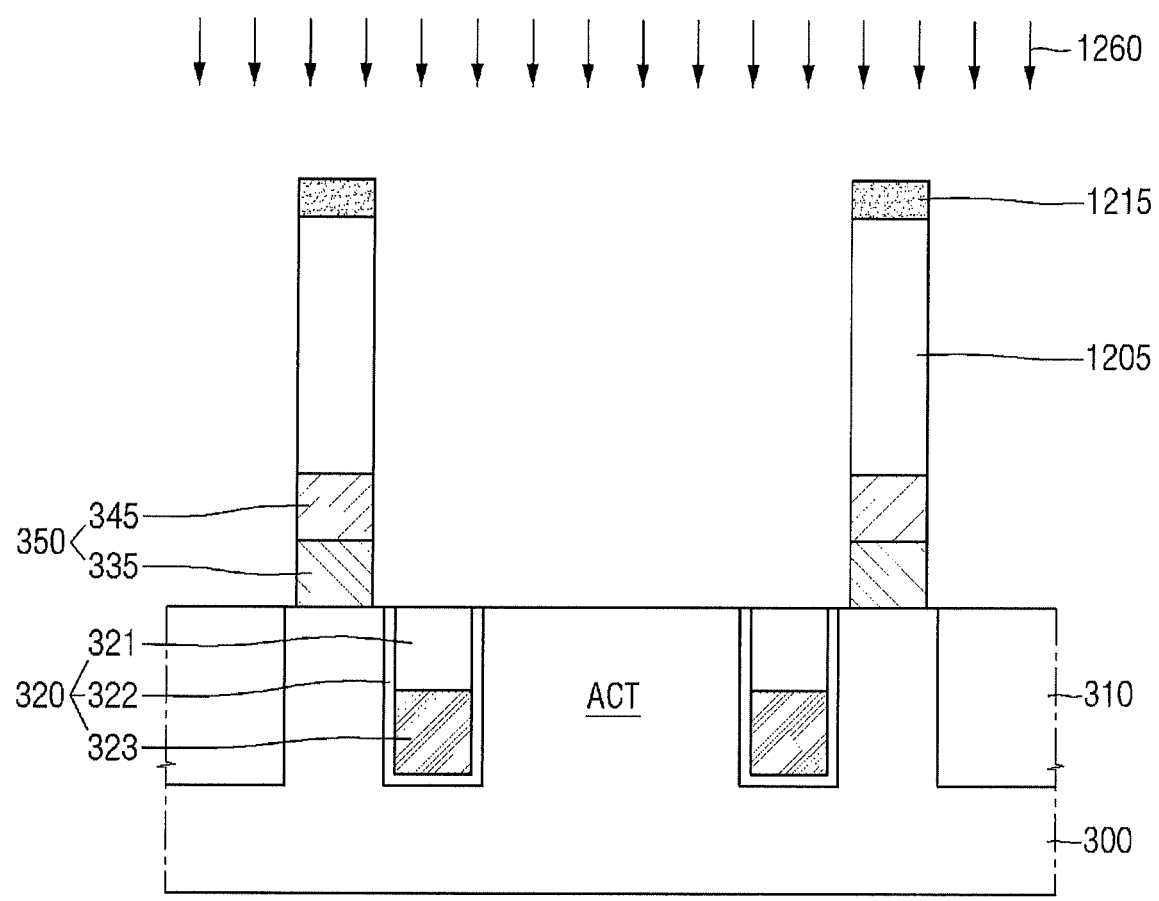

Referring to FIG. 12, the bit line contact plug layer 330 and the bit line electrode layer 340 are etched using the second hard mask pattern 1215 and the first hard mask pattern 1205 as an etching mask. As a result of etching, a bit line contact plug 335 and a bit line electrode 345 may be formed as a portion of a bit line structure 350. The etching of the bit line contact plug layer 330 and the bit line electrode layer 340 may be dry etching using an etching gas 1260 such as HBr.

FIGS. 13 to 21 are cross sections illustrating processing steps in the fabrication of a semiconductor device according to some embodiments of the present inventive concept. In the following description, components having reference numerals similar to those of the components discussed above with respect to FIGS. 1 through 12 may represent similar components.

Figure 13:
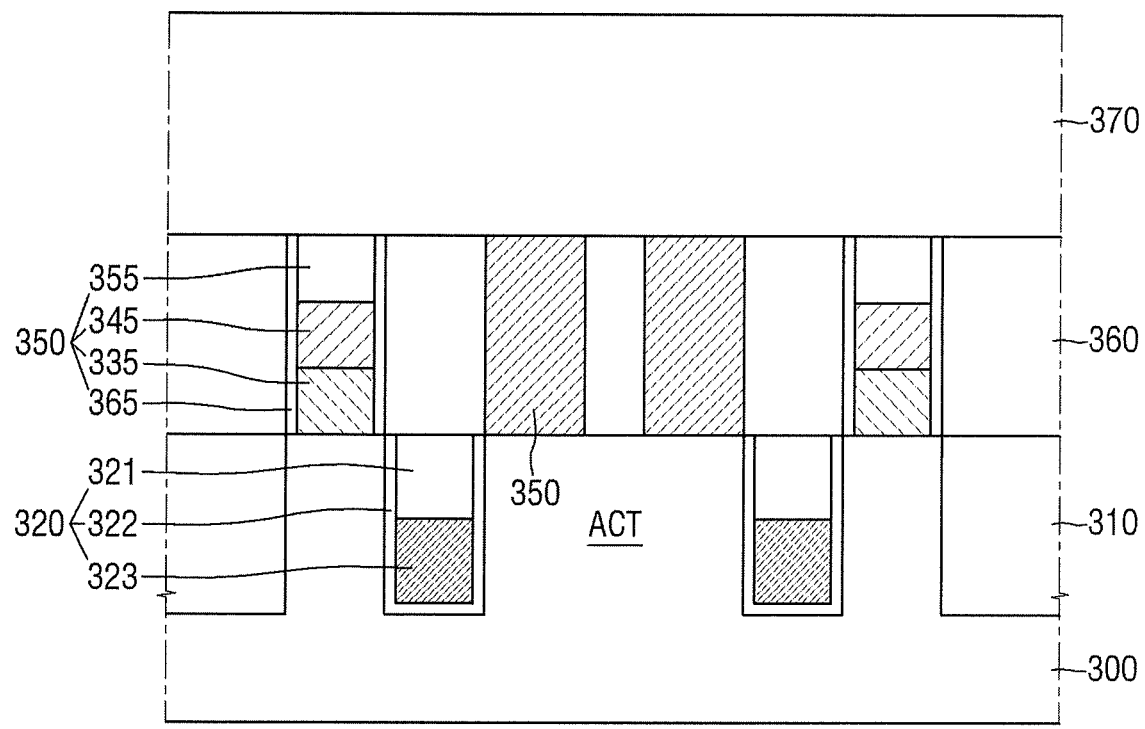
FIGS. 13 to 21 are diagrams illustrating processing steps in the fabrication of semiconductor devices in accordance with some embodiments of the present inventive concept.

Referring to FIG. 13, the semiconductor device fabricating method described with reference to FIG. 12 will be further described. In particular, an interlayer insulating layer 360 is formed on the buried gate 320, and the bit line structure 350 including the bit line contact plug 335, the bit line electrode 345 and a bit line capping layer 355 and a bit line spacer 365 is formed in the interlayer insulating layer 360. A landing pad 305 is formed in the interlayer insulating layer 360 and an insulating layer 370 is formed on the interlayer insulating layer 360.

The bit line capping layer 355 may be formed to cover the upper surface of the bit line electrode 345. The bit line capping layer 355 may be formed as the first hard mask pattern 1205 used for patterning the line shape of the bit line contact plug 335 and the bit line electrode 345 partially remains in the semiconductor device fabricating method discussed above with reference to FIGS. 6 to 12.

The bit line spacer 365 may be formed, for example, by forming a spacer layer so as to cover the structure in which the bit line contact plug 335, the bit line electrode 345 and the bit line capping layer 355 are stacked and the upper surface of the active region ACT and anisotropically etching the spacer layer.

The interlayer insulating layer 360 may be formed to cover the upper surface of the substrate 300. The interlayer insulating layer 360 may include, for example, an oxide layer. The interlayer insulating layer 360 may be formed to surround the bit line structure 350 and the side surface of the landing pad 305.

The landing pad 305 may be formed in the interlayer insulating layer 360. The landing pad 305 may pass through the interlayer insulating layer 360. The lower surface of the landing pad 60 may be in contact with the substrate 300, and the upper surface thereof may be in contact with the lower surface of a lower electrode 380 (see FIG. 21).

The landing pad 305 may be formed by forming a trench in the interlayer insulating layer 360 and filling the trench with a metal material such as tungsten, a doped semiconductor material, conductive metal nitride, a metal-semiconductor compound or the like. A doped region may be formed in the active region ACT in contact with the landing pad 305 to serve as a source/drain region.

Figure 14:
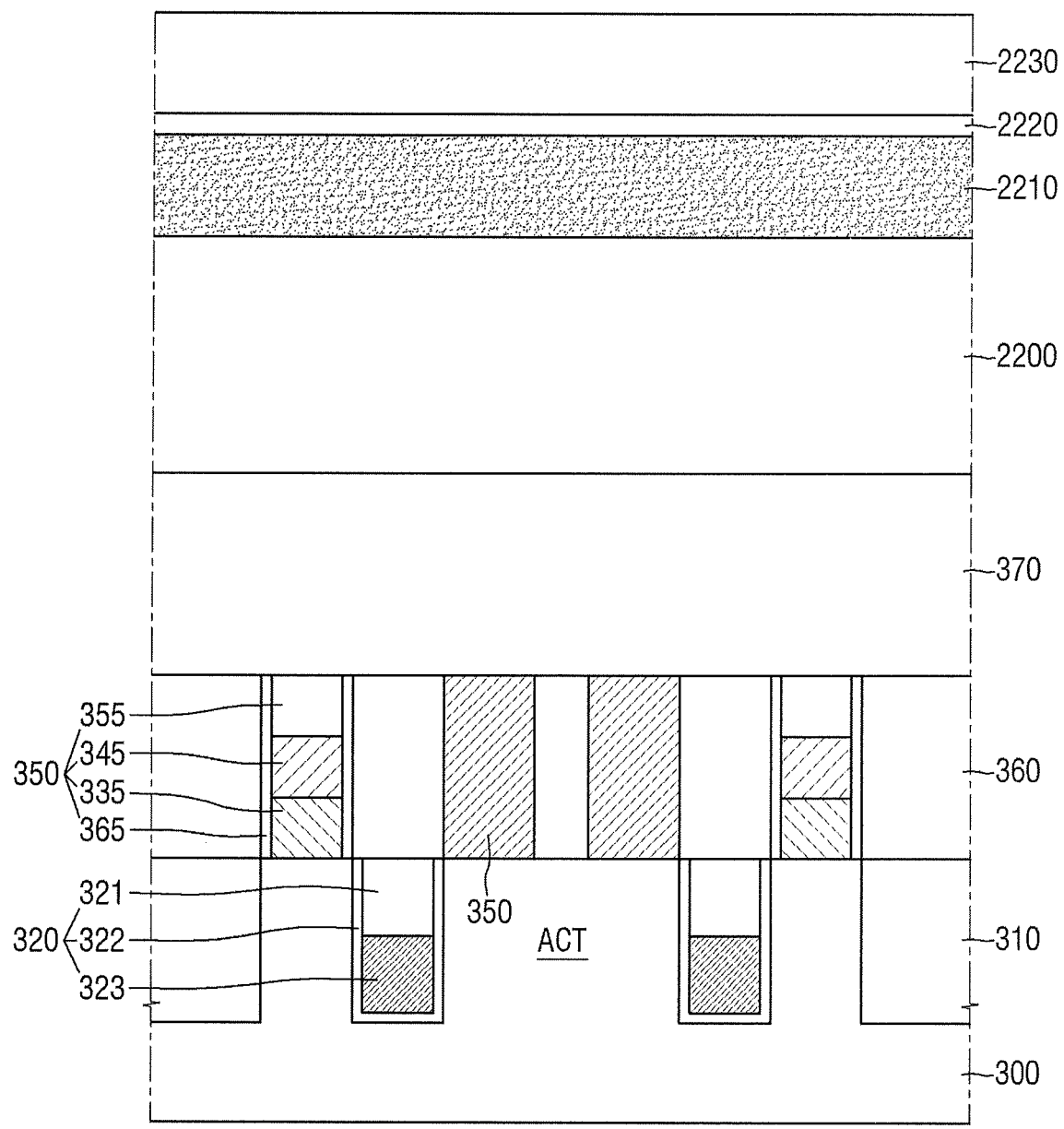

Referring to FIG. 14, a first hard mask layer 2200, a second hard mask layer 2210, a lower layer 2220 and a photoresist layer 2230 are sequentially formed on the insulating layer 370. The first hard mask layer 2200 may be formed on the bit line contact plug layer 330 by, for example, performing a process such as ALD, CVD or spin coating on an amorphous carbon layer. In other words, the first hard mask layer 2200 may be formed to be similar to the first hard mask layer 200 described with reference to FIG. 1.

The second hard mask layer 2210 may be formed on the first hard mask layer 2200. The formation of the second hard mask layer 2210 may include forming an amorphous silicon layer on the first hard mask layer 2200, and forming a doped amorphous silicon layer by doping a pentavalent element such as phosphorus (P) and arsenic (As) as impurities, similarly to the second hard mask layer 210 described with reference to FIG. 1.

The lower layer 2220 and the photoresist layer 2230 may be formed on the second hard mask layer 2210. The lower layer 2220 and the photoresist layer 2230 may be formed by a process similar to that of the lower layer 220 and the photoresist layer 230 of FIG. 1, respectively.

Figure 15:
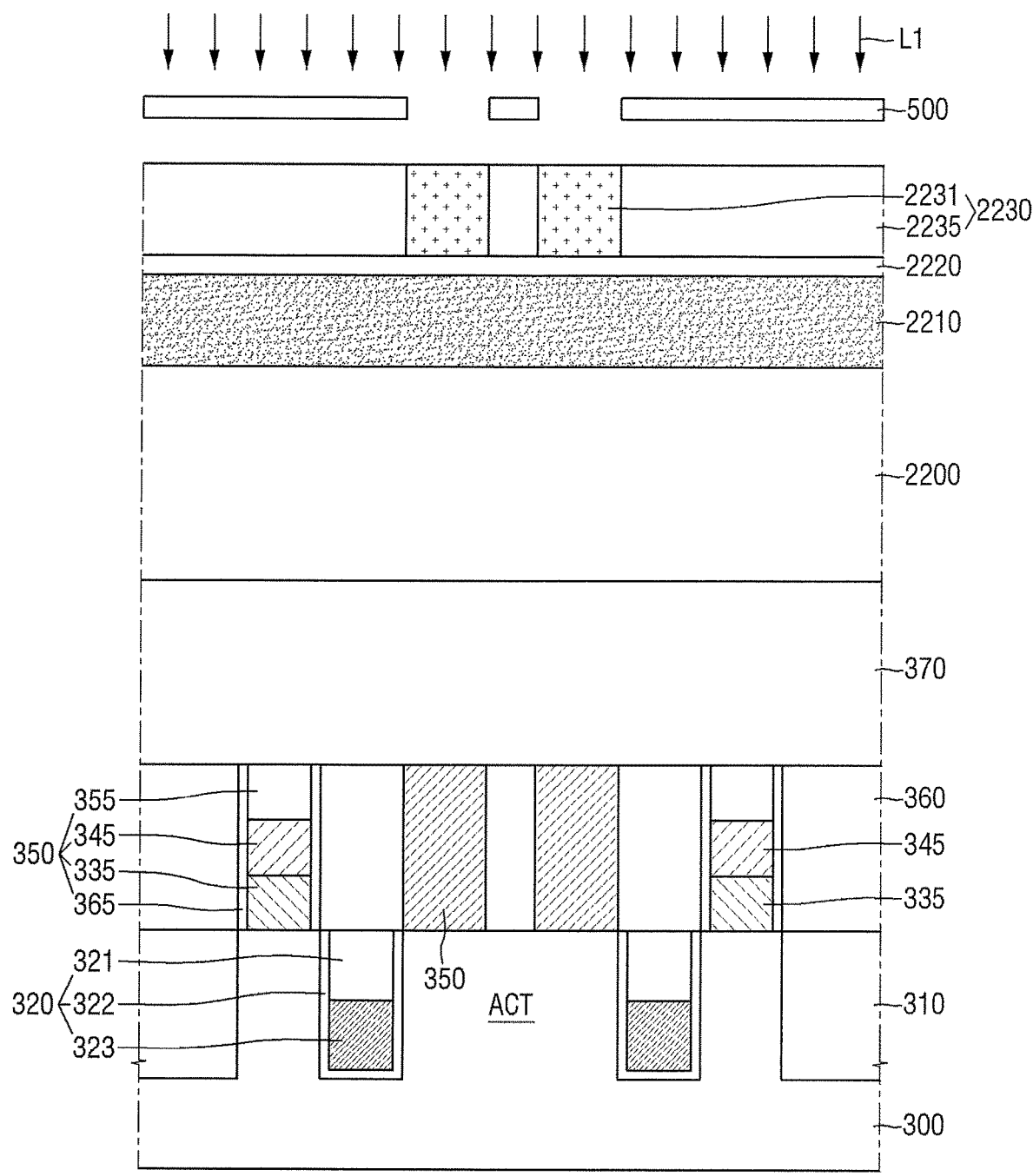

Referring to FIG. 15, an exposure process is performed by irradiating the photoresist layer 2230 with light L1. The exposure process may be performed by disposing the exposure mask 500 on the photoresist layer 2230 and irradiating light through an opening included in the exposure mask 500. As shown in FIG. 8, through the exposure process, the photoresist layer 2230 may be divided into an exposed portion 2231 exposed to the light L1 and an unexposed portion 2235.

Figure 16:
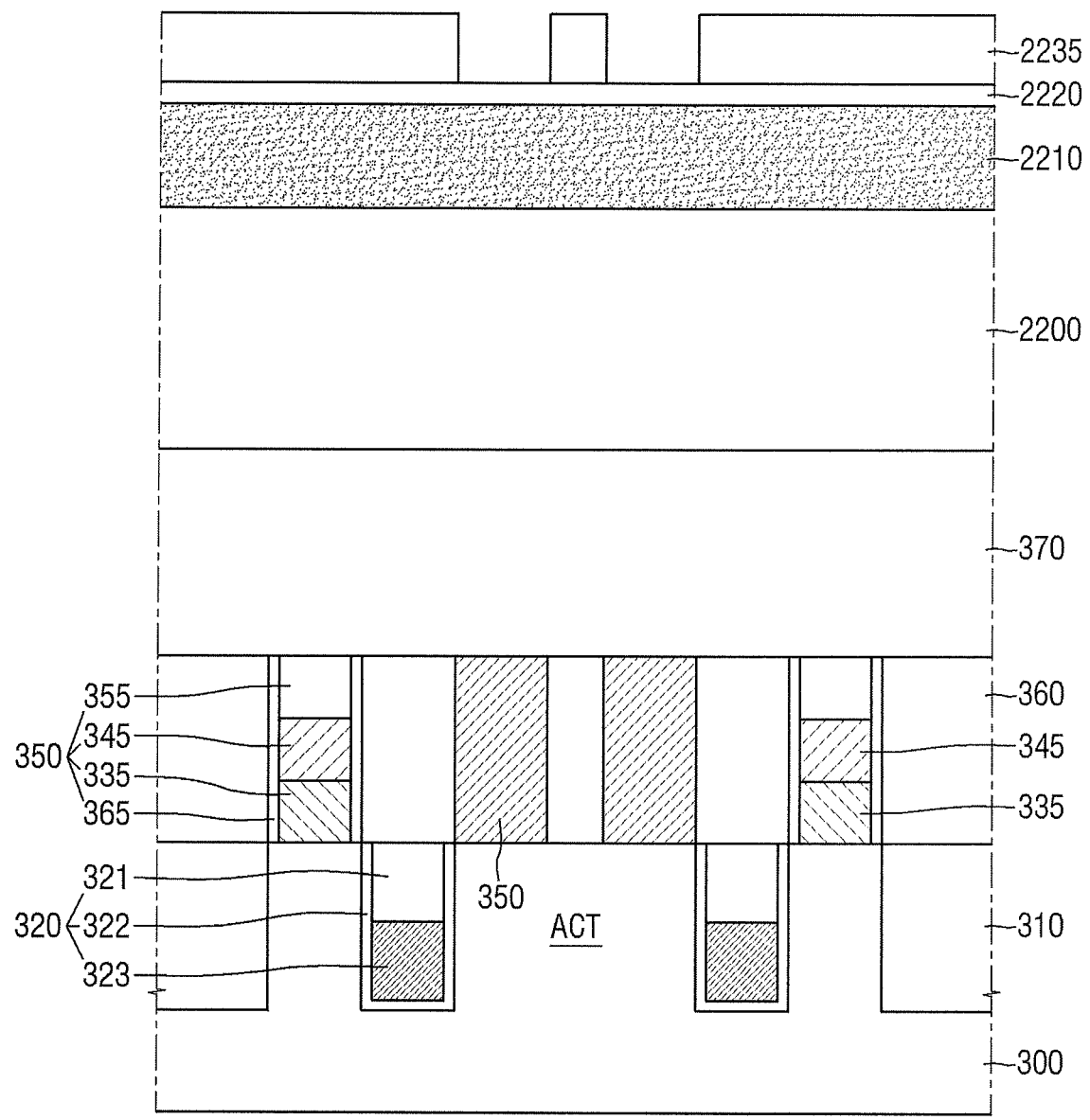

Referring to FIG. 16, the exposed portion 2231 is selectively removed from the photoresist layer 2230 through a developing process. A portion of the photoresist layer 2230 which remains without being removed may be formed on the lower layer 2220 as a photoresist pattern 2235.

Figure 17:
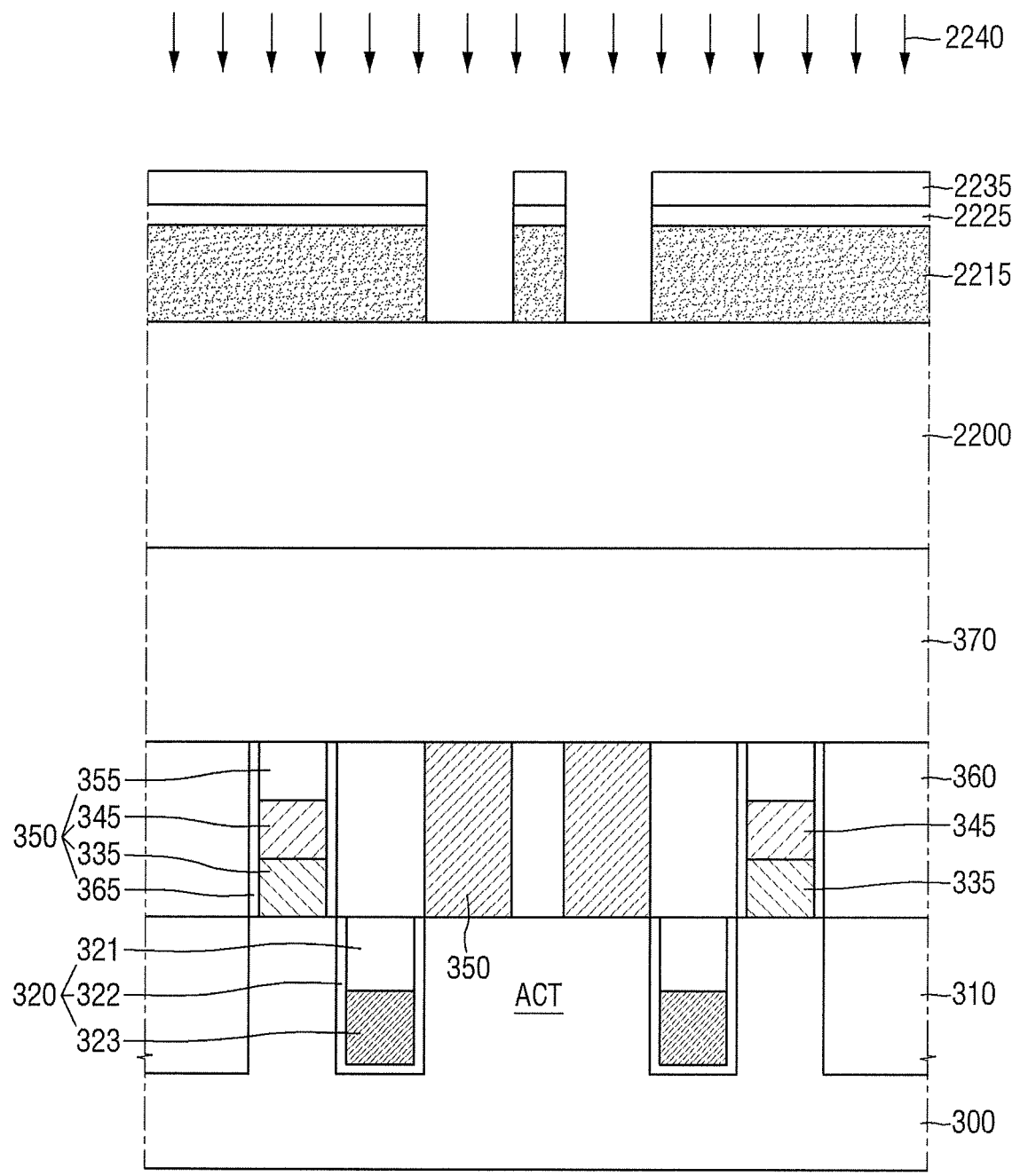

Referring to FIG. 17, the lower layer 2220 and the second hard mask layer 2210 are patterned using the photoresist pattern 2235 as an etching mask.

As discussed above, the photoresist pattern 2235 may have an etching selectivity with respect to the second hard mask layer 2210. Furthermore, as the second hard mask layer 2210 includes an impurity-doped amorphous silicon layer, the etching selectivity of the photoresist pattern 2235 may be increased as compared with a case where the second hard mask layer 2210 is an undoped amorphous silicon layer. Therefore, the thickness of the photoresist pattern 2235 required for etching the second hard mask layer 2210 having the same thickness can be reduced, and the time required for the semiconductor device fabricating method can be reduced.

When the etching of the lower layer 1220 and the second hard mask layer 1210 is completed, a lower layer pattern 2225 and a second hard mask pattern 2215 may be formed. Even after the formation of the lower layer pattern 2225 and the second hard mask pattern 2215 is completed, the photoresist pattern 2235 may remain without being completely etched.

Figure 18:
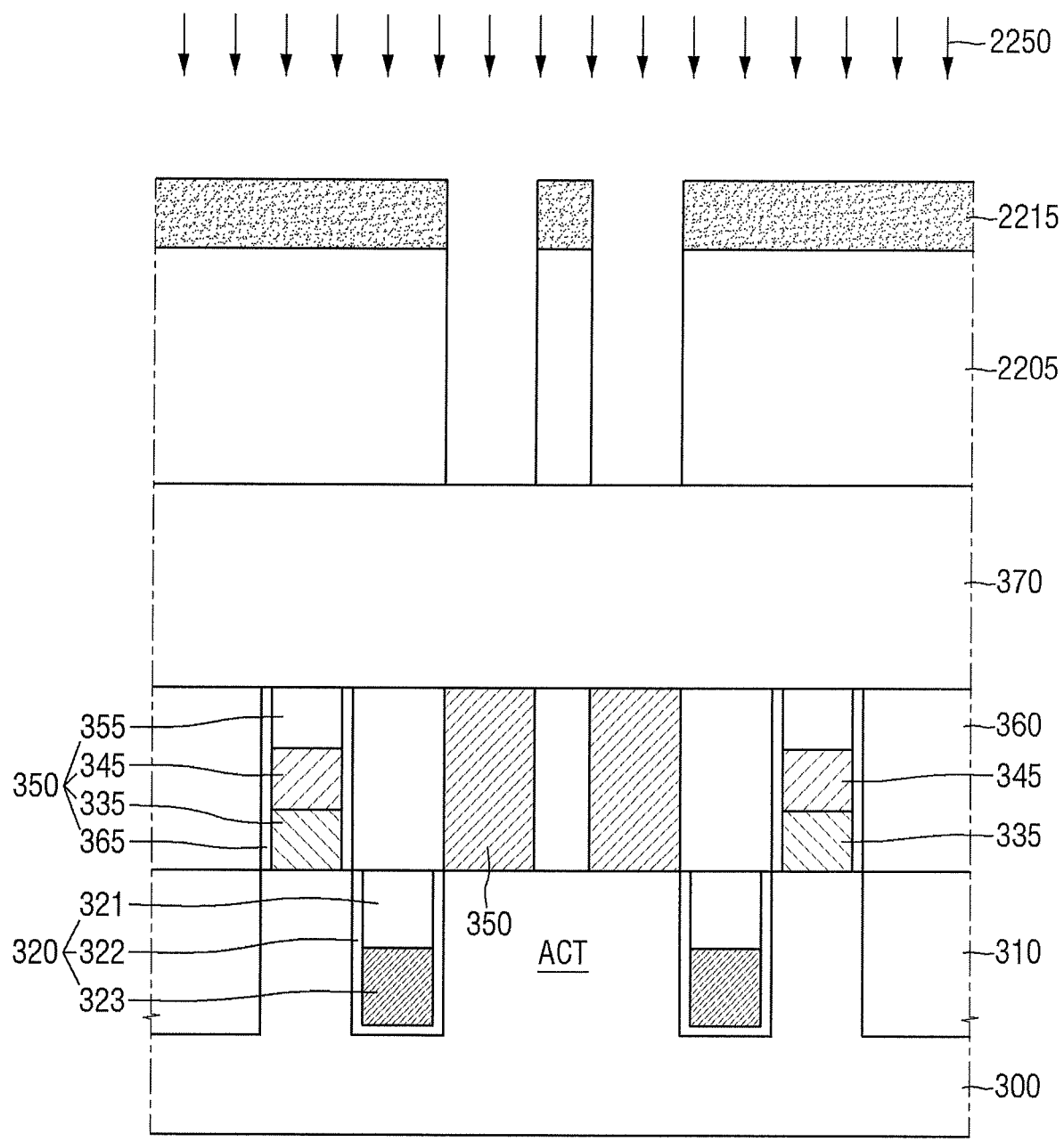

Referring to FIG. 18, the first hard mask layer 2200 is patterned using the photoresist pattern 2235, the lower layer pattern 2225 and the second hard mask pattern 2215 as an etching mask. As a result of patterning, the first hard mask layer 2200 is etched to form a first hard mask pattern 2205 on the insulating layer 370.

Although FIG. 18 illustrates the second hard mask pattern 2215 on the first hard mask pattern 2205, the present inventive concept is not limited thereto. In some embodiments, on the first hard mask pattern 2205, the second hard mask pattern 2215 may be completely removed.

Figure 19:
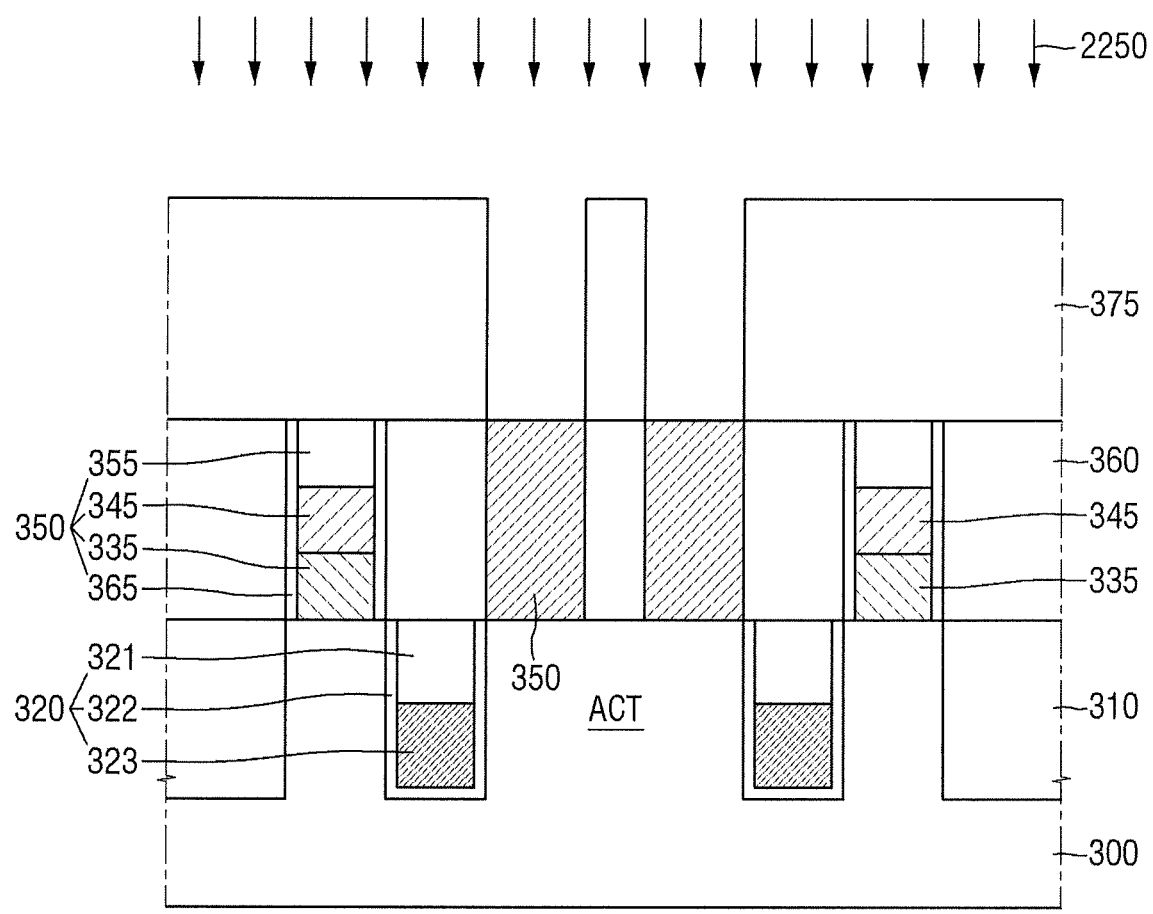

Referring to FIG. 19, the insulating layer 370 is patterned using the second hard mask pattern 2215 and the first hard mask pattern 2205 as an etching mask. As a result of patterning, a trench 376 and an insulating layer pattern 375 are formed. An etchant 2250 for etching the insulating layer 370 may include, for example, a gas such as carbon tetrafluoride ($CF_4$).

Figure 20:
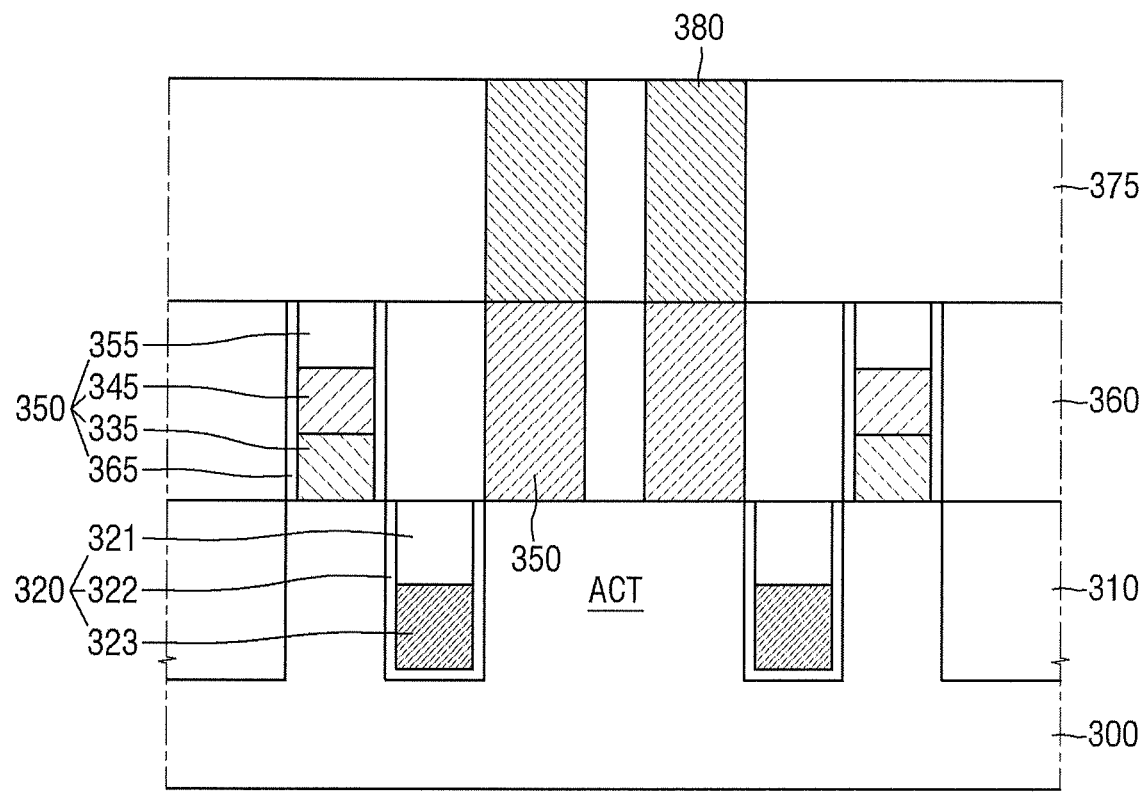

Referring to FIG. 20, a lower electrode 380 is formed in the trench 376. The formation of the lower electrode 380 may include, for example, filling the trench 376 with a conductive material and removing the conductive material on the upper surface of the insulating layer pattern 375 through a process such as etch-back or chemical mechanical polishing (CMP). The conductive material may include metal, a metal compound or a combination thereof.

Figure 21:
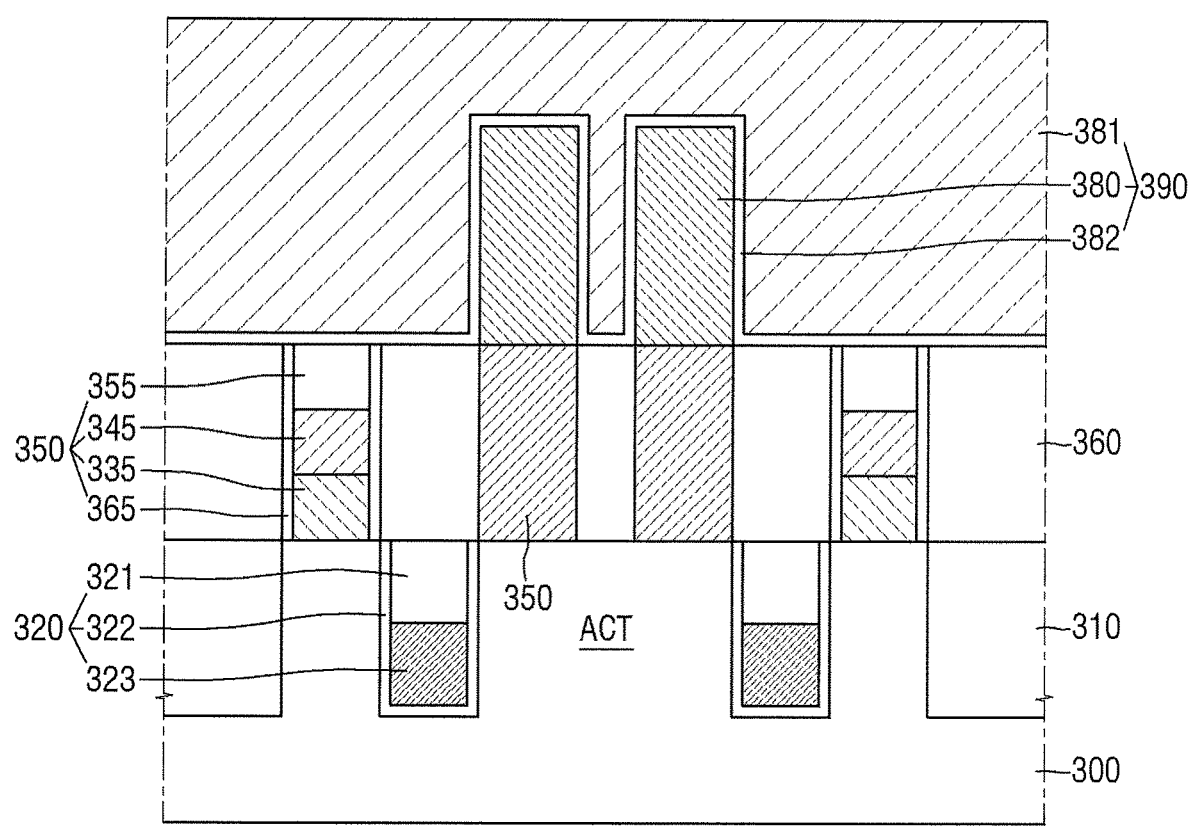

Referring to FIG. 21, the insulating layer pattern 375 around the lower electrode 380 is completely removed, and a dielectric layer 382 is conformally formed on the lower electrode 380 and the interlayer insulating layer 360. An upper electrode 381 is formed to cover the dielectric layer 382 and the lower electrode 380 to form a capacitor 390.

The insulating layer pattern 375 may be removed by etching using an etchant containing a gas, such as $CF_4$, in the same manner as the etching process of the insulating layer 370.

The formation of the dielectric layer 382 may include conformally forming a high dielectric constant material such as hafnium or zirconium (Zr) on the lower electrode 380 and the interlayer insulating layer 360, but the present inventive concept is not limited thereto. The dielectric layer 382 may include, for example, at least one of hafnium oxide, hafnium silicon oxide, hafnium oxynitride, zirconium oxide, zirconium silicon oxide, tantalum oxide and titanium oxide without departing from the scope of the present inventive concept.

The upper electrode 381 may be formed by forming a conductive material so as to cover the dielectric layer 382 and the lower electrode 380. The upper electrode 160 may include, for example, metal, a metal compound or a combination thereof.

The formation of the capacitor 390 may be completed by forming the lower electrode 380, the upper electrode 3810 and the dielectric layer 382.

FIGS. 22 to 27 are cross sections illustrating processing steps in the fabrication of a semiconductor device according to some embodiments of the present inventive concept. In the following description, components having reference numerals similar to those of the components described in the above-described embodiments may represent similar components.

Figure 22:
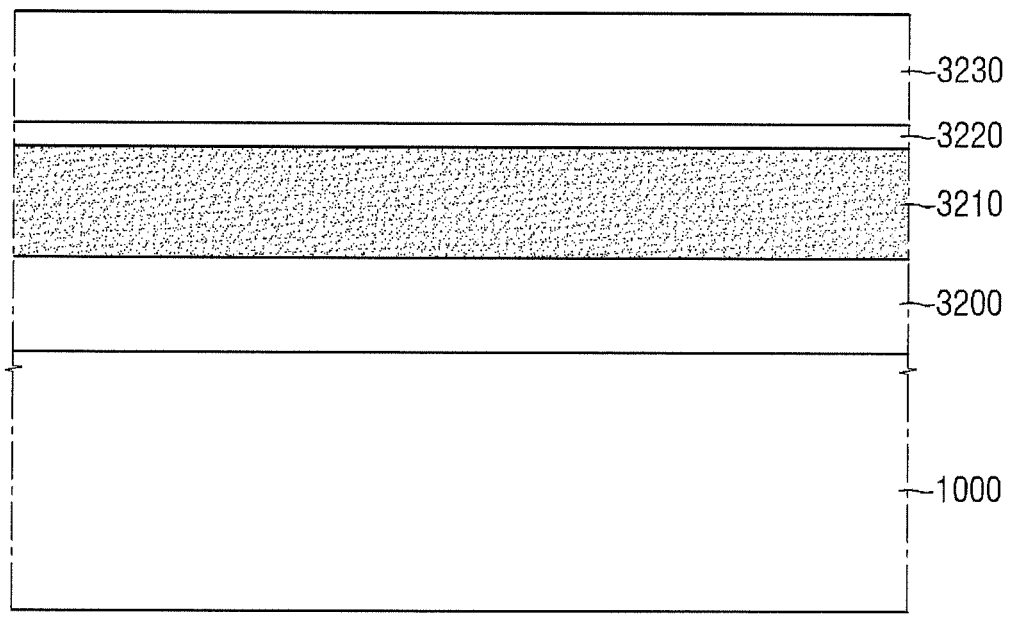
FIGS. 22 to 27 are diagrams illustrating processing steps in the fabrication of semiconductor devices in accordance with some embodiments of the present inventive concept.
Figure 23:
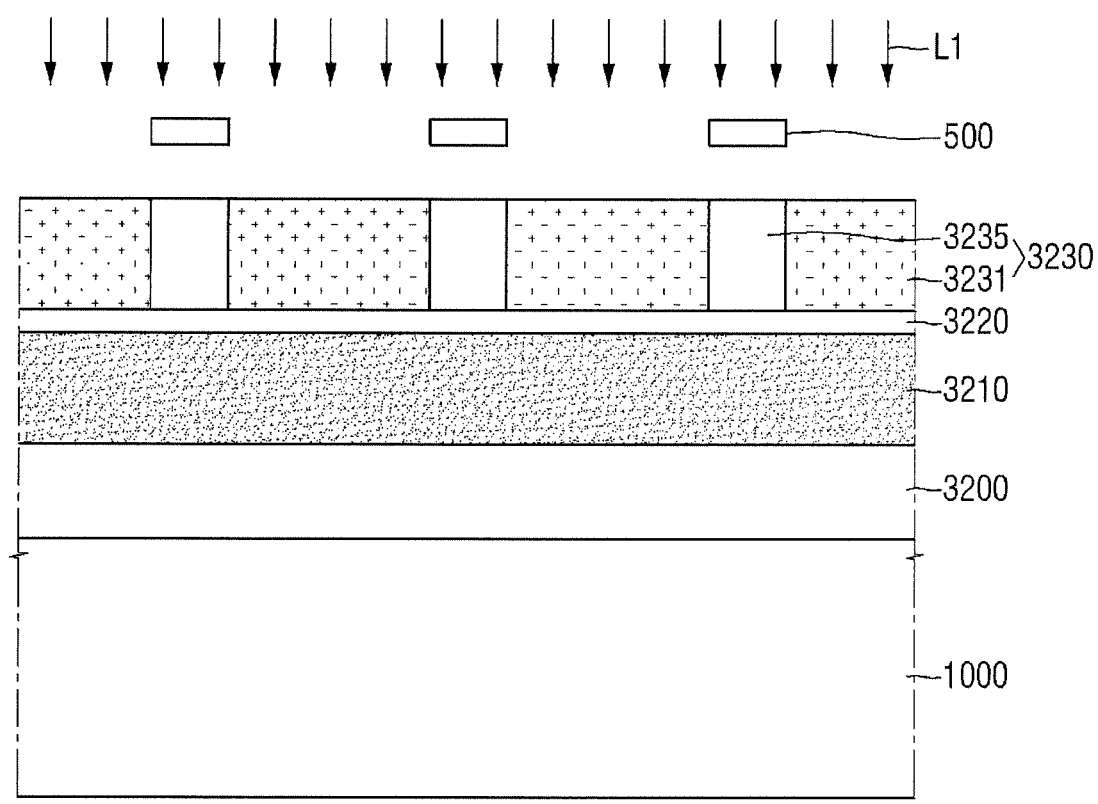
Figure 24:
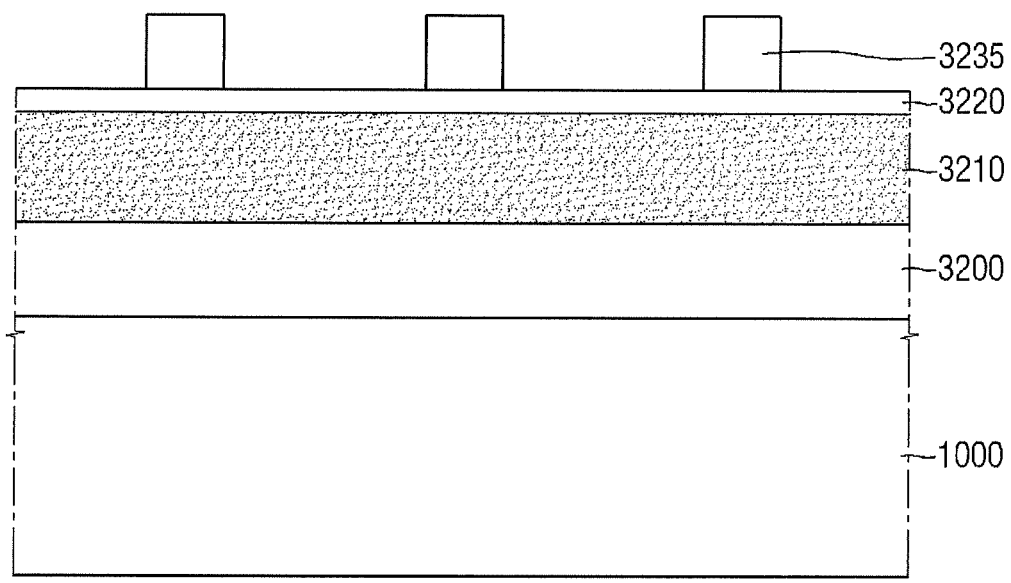
Figure 25:
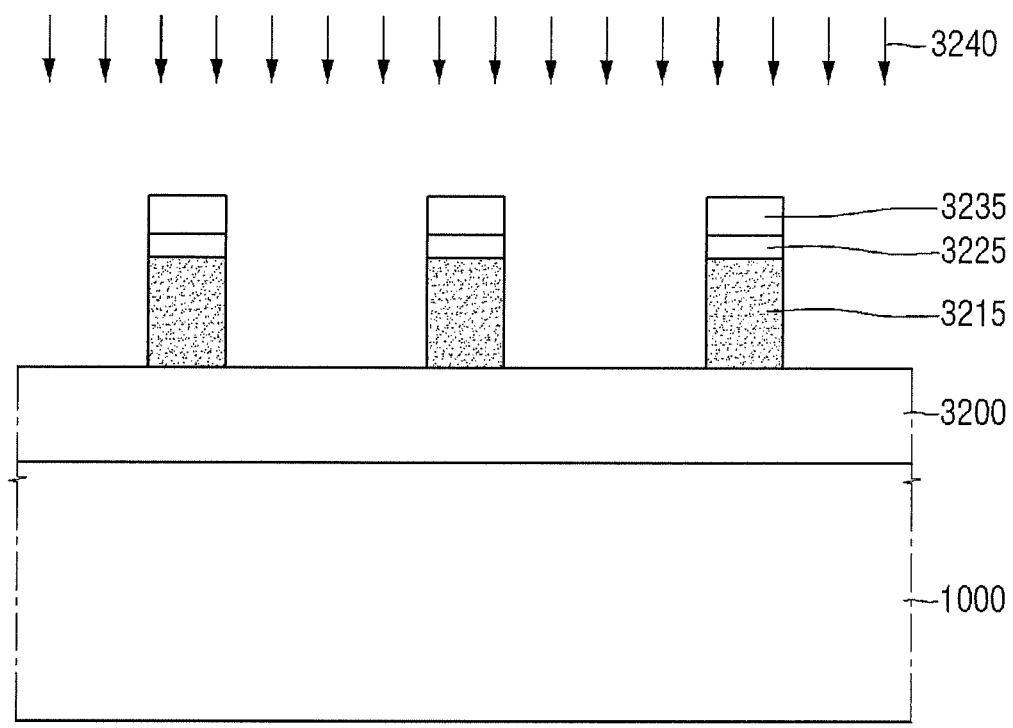
Figure 26:
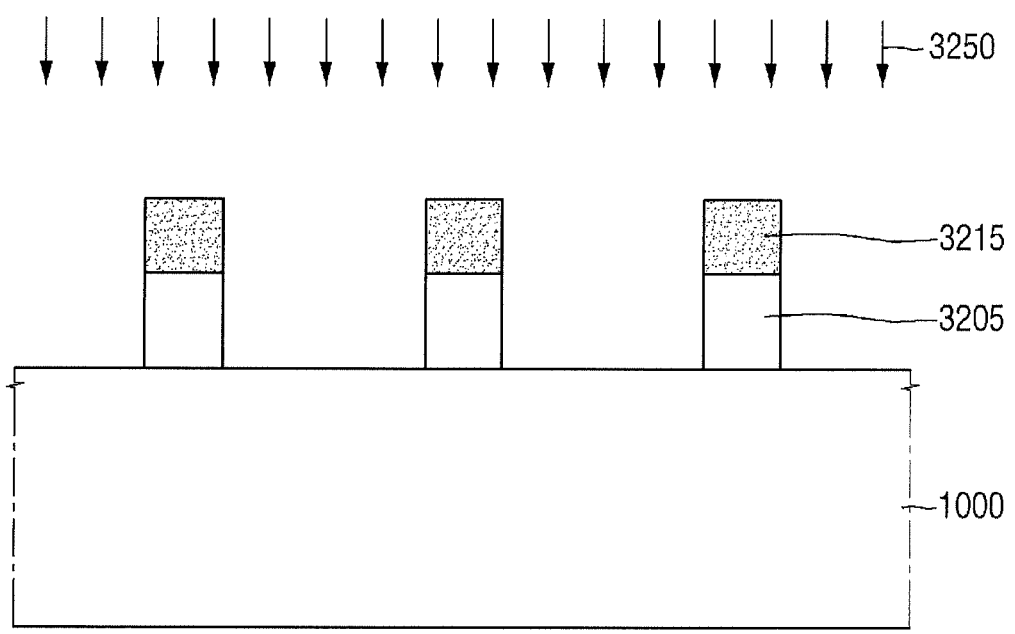

Referring to FIG. 22, a first hard mask layer 3200, a second hard mask layer 3210, a lower layer 3220 and a photoresist layer 3230 are sequentially formed on a substrate 1000.

The substrate 1000 may be, for example, a bulk silicon or silicon-on-insulator (SOI) substrate as described above. In these embodiments, it is assumed that the substrate 1000 is a silicon substrate.

A process of forming a first hard mask pattern 3205 and a second hard mask pattern 3215 as shown in FIGS. 23 to 26 is similar to the process of forming the first hard mask pattern 205 and the second hard mask pattern 215 described above with reference to FIGS. 2 to 5, and thus, it will be omitted.

Figure 27:
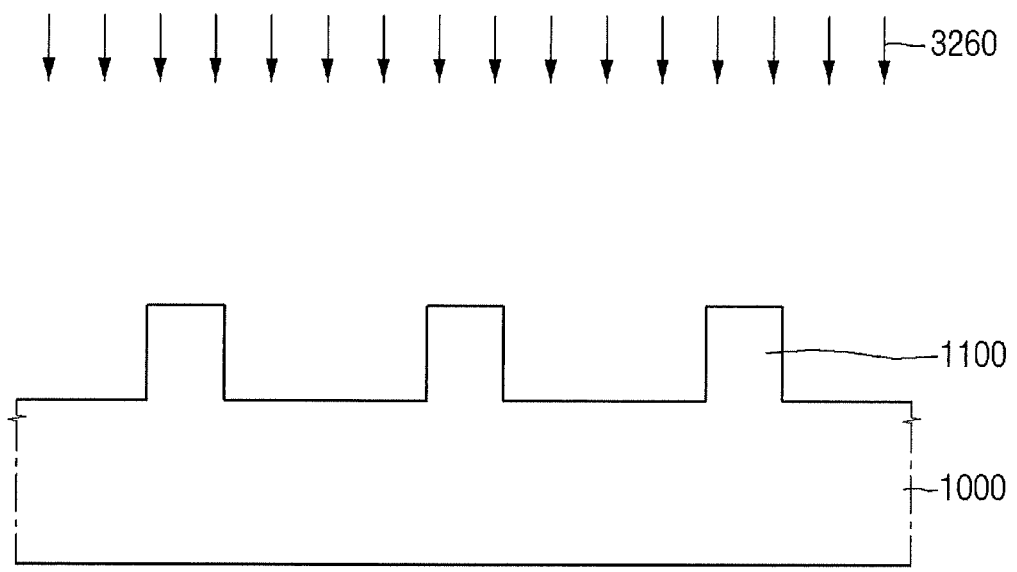

Referring to FIG. 27, the substrate 1000 is patterned using the first hard mask pattern 3205 and the second hard mask pattern 3215 as an etching mask. As a result of patterning of the substrate 1000, a fin pattern 1100 may be formed to extend in one direction.

As discussed above with respect to FIGS. 1 through 28, the amount of etching that occurs during a semiconductor process can be changed. In other words, boron doping can be used to reduce etch selectivity with respect to a photo resist, and phosphorus doping can be used to increase etch selectivity with respect to the photo resist. Thus, some embodiments of the present inventive concept may reduce a thickness of the photo resist by increasing the etch selectivity to the photo resist in embodiments using phosphorus doping.

The embodiments of the present inventive concept have been described with reference to the attached drawings, but it may be understood by one of ordinary skill in the art that the present inventive concept may be performed one of ordinary skill in the art in other specific forms without changing the technical concept or essential features of the present inventive concept. Further, the above-described embodiments are merely examples and do not limit the scope of the rights of the present inventive concept.

What is claimed is:

1. A method of fabricating a semiconductor device, comprising:
   sequentially forming a first hard mask layer, a second hard mask layer and a photoresist layer on a target layer;
   patterning the photoresist layer to form a photoresist pattern;
   sequentially patterning the first hard mask layer and the second hard mask layer using the photoresist pattern as an etching mask to form a first hard mask pattern and a second hard mask pattern on the first hard mask pattern; and etching the target layer using the first hard mask pattern and the second hard mask pattern as an etching mask, wherein the second hard mask layer includes impurity-doped amorphous silicon, and wherein the impurity-doped amorphous silicon includes a pentavalent element as a doped impurity.

2. The method of claim 1, wherein the pentavalent element is phosphorus.

3. The method of claim 1, wherein the patterning the photoresist layer to form a photoresist pattern comprises:

exposing the photoresist layer to extreme ultraviolet (EUV) light; and developing the exposed photoresist layer to form the photoresist pattern.

4. The method of claim 1, wherein the first hard mask layer includes an amorphous carbon layer.

5. The method of claim 4:

wherein the target layer includes a metal layer; and wherein etching the target layer using the first hard mask pattern as an etching mask comprises etching the metal layer to form a metal layer pattern.

6. The method of claim 5, wherein etching the target layer comprises dry etching the target layer.

7. The method of claim 6, wherein the etching the target layer comprises etching the target layer using a hydrogen bromide (HBr) gas.

8. The method of claim 1, wherein the first hard mask layer comprises silicon oxide.

9. The method of claim 8:

wherein the target layer includes an insulating layer; and wherein the etching the target layer using the second hard mask pattern as an etching mask comprises etching the insulating layer to form a trench in the insulating layer.

10. The method of claim 1, further comprising forming a lower layer between the photoresist layer and the second hard mask layer.

11. A method of fabricating a semiconductor device, comprising:

forming, on a substrate, a device isolation layer defining an active region;

forming a buried gate in the active region;

forming, on the substrate, a metal layer in contact with the active region;

forming a first hard mask layer on the metal layer, a second hard mask layer on the first hard mask layer, and a photoresist layer on the second hard mask layer;

patterning the photoresist layer to form a photoresist pattern;

patterning the second hard mask layer using the photoresist pattern as an etching mask to form a second hard mask pattern;

patterning the first hard mask layer using the second hard mask pattern as an etching mask to form a first hard mask pattern; and etching the metal layer using the first hard mask pattern and the second hard mask pattern as an etching mask to form a metal layer pattern, wherein the second hard mask layer includes impurity-doped amorphous silicon, and wherein the first hard mask layer includes an amorphous carbon layer.

12. The method of claim 11, wherein the impurity-doped amorphous silicon includes a pentavalent element as a doped impurity.

13. The method of claim 12, wherein the pentavalent element is phosphorus.

14. The method of claim 11, wherein the patterning the photoresist layer to form a photoresist pattern comprises:

exposing the photoresist layer to extreme ultraviolet (EUV) light; and developing the exposed photoresist layer to form the photoresist pattern.

15. The method of claim 11, further comprising a lower layer between the photoresist layer and the second hard mask layer.

16. The method of claim 11:

wherein the metal layer pattern includes a bit line structure; and wherein the bit line structure includes a bit line plug on the active region and a bit line electrode on the bit line plug.

17. The method of claim 16, wherein the second hard mask pattern is a capping layer covering the bit line electrode.

18. A method of fabricating a semiconductor device, comprising:

sequentially forming a first hard mask layer, a second hard mask layer and a photoresist layer on a target layer, the first hard mask layer including an amorphous carbon layer and the second hard mask layer including impurity-doped amorphous silicon;

patterning the photoresist layer to form a photoresist pattern;

etching the second hard mask layer using the photoresist pattern as an etching mask to form a second hard mask pattern; and etching the first hard mask layer using the second hard mask pattern as an etching mask to form a first hard mask pattern.

19. The method of claim 18, wherein the impurity-doped amorphous silicon includes a pentavalent element as a doped impurity.

20. The method of claim 19, wherein the pentavalent element is phosphorus.

* * * * *